US010013296B2

(12) United States Patent
El-Maleh et al.

(10) Patent No.: US 10,013,296 B2
(45) Date of Patent: Jul. 3, 2018

(54) METHOD OF FAULT TOLERANCE IN COMBINATIONAL CIRCUITS

(71) Applicant: KING FAHD UNIVERSITY OF PETROLEUM AND MINERALS, Dhahran (SA)

(72) Inventors: Aiman Helmi El-Maleh, Dhahran (SA); Ahmad Tariq Sheikh, Islamabad (PK)

(73) Assignee: King Fahd University of Petroleum and Minerals, Dhahran (SA)

( * ) Notice: Subject to any disclaimer, the term of this patent is extended or adjusted under 35 U.S.C. 154(b) by 251 days.

(21) Appl. No.: 15/015,654

(22) Filed: Feb. 4, 2016

(65) Prior Publication Data

US 2017/0228270 A1    Aug. 10, 2017

(51) Int. Cl.
| | | |
|---|---|---|
| *G06F 11/07* | (2006.01) | |
| *G01R 31/3177* | (2006.01) | |
| *G01R 31/3181* | (2006.01) | |
| *G01R 31/3183* | (2006.01) | |
| *G06F 17/50* | (2006.01) | |

(52) U.S. Cl.
CPC ........ *G06F 11/076* (2013.01); *G01R 31/3177* (2013.01); *G01R 31/31816* (2013.01);
(Continued)

(58) Field of Classification Search
CPC .. G06F 11/07; G06F 11/0703; G06F 11/0751; G06F 11/076; G06F 11/079; G06F 11/0793; G06F 17/50; G06F 17/5045; G06F 17/5068; G01R 31/3177; G01R 31/3183; G01R 31/318321; G01R 31/318342; G01R 31/31835; G01R 31/318357; G01R 31/318502; H03K 19/003; H03K 19/0033;
(Continued)

(56) References Cited

U.S. PATENT DOCUMENTS

| 7,509,600 B2 | 3/2009 | Rajski et al. |
| 8,341,473 B2 | 12/2012 | Bertacco et al. |
| 8,640,063 B1 | 1/2014 | El-Maleh et al. |

OTHER PUBLICATIONS

Sobeeh Almukhaizim, et al., "Soft-Error Tolerance and Mitigation in Asynchronous Burst-Mode Circuits", IEEE Transactions on Very Large Scale Integration (VLSI) Systems, vol. 17, No. 7, Jul. 2009, pp. 869-882.

(Continued)

*Primary Examiner* — Albert Decady
*Assistant Examiner* — Christian Dorman
(74) *Attorney, Agent, or Firm* — Oblon, McClelland, Maier & Neustadt, L.L.P.

(57) ABSTRACT

Described herein is a method implemented by circuitry for providing fault tolerance in a combinational circuit. The circuitry identifies sensitive gates of the circuit that require protection from at least one of a first type of fault and a second type of fault. Further, circuitry computes for each first type of transistor included in the sensitive gate, a first failure probability, and for each second type of transistor included in the sensitive gate, a second failure probability. The circuitry calculates a first parameter corresponding to a number of the first type of transistors for which the computed first failure probabilities exceed a first predetermined threshold and a second parameter corresponding to a number of second type of transistors for which the computed second failure probabilities exceed a second predetermined threshold to determine a protection type based on an area overhead constraint.

20 Claims, 17 Drawing Sheets

(52) U.S. Cl.
CPC .... *G01R 31/318321* (2013.01); *G06F 11/079* (2013.01); *G06F 11/0793* (2013.01); *G06F 17/5045* (2013.01); *G06F 17/5068* (2013.01)

(58) Field of Classification Search
CPC .......... H03K 19/00392; H03K 19/007; H03K 19/0075
See application file for complete search history.

(56) References Cited

OTHER PUBLICATIONS

Aiman H. El-Maleh, et al., "Defect Tolerant $N^2$-Transistor Structure for Reliable Nanoelectronic Designs", IET Computers & Digital Techniques, vol. 3, No. 6, 2009, 20 pages.

Cristiano Lazzari, et al., "Asymmetric transistor sizing targeting radiation-hardened circuits", Electr Eng, Jun. 15, 2011, 8 pages.

Quming Zhou, et al., "Gate Sizing to Radiation Harden Combinational Logic", IEEE Transactions on Computer-Aided Design of Integrated Circuits and Systems, vol. 25, No. 1, Jan. 2006, pp. 155-166.

Warin Sootkaneung, et al., "Optimizing Device Size for Soft Error Resilience in Sub-Micron Logic Circuits", $2^{nd}$ Asia Symposium on Quality Electronic Design, 2010, pp. 235-242.

Warin Sootkaneung, et al., "On Techniques for Handling Soft Errors in Digital Circuits", International Test Conference, Paper 25.2, 2010, 9 pages.

Warin Sootkaneung, et al., "Sizing Techniques for Improving Soft Error Immunity in Digital Circuits", International Conference on VLSI Design & Communication Systems, 2010, 6 pages.

Rajeev R. Rao, et al., "Soft Error Reduction in Combinational Logic Using Gate Resizing and Flipflop Selection", ICCAD, Nov. 5-9, 2006, pp. 502-509.

apex2 Reliability apex3 Reliability apex4 Reliability

Time Comparison ized nor impliedly admitted as prior art against the present disclo-
METHOD OF FAULT TOLERANCE IN COMBINATIONAL CIRCUITS

FIELD OF INVENTION

The present disclosure relates generally to providing fault tolerance mechanisms in combinational circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

As fabrication technology reaches nano-levels, combination circuit systems are becoming more prone to manufacturing defects and have a high susceptibility to soft errors. Soft errors occur due to the exponential decrease in device feature size. Soft errors, which are caused by radioactive decay and cosmic rays, can flip the output of a gate and cause an error, if propagated to an output of the circuit.

As complimentary metal-oxide semiconductor (CMOS) technology is continuously improving and shrinking to the nanometer scale, several studies have indicated that high-density chips will be increasingly accompanied by manufacturing defects and susceptible to dynamic faults during the chip operation. Nanoscale devices are limited by several characteristics: most dominant of which are the device's higher defect rates and the increased susceptibility to soft errors.

Reliability in systems can be achieved by redundancy. Redundancy can be added at the module-level, gate-level, transistor-level or even at the software level. At the software level certain software transformations are applied to reduce the vulnerability of critical instructions of a program. The design of reliable systems by using redundant unreliable components was initiated by John von Neumann in the 1950s. Since then, a plethora of research has been conducted to rectify soft errors in combinational and sequential circuits by applying hardware redundancy. For instance, the Generalized Modular Redundancy (GMR) scheme takes into account the probability of occurrence of each combination at the output of a circuit. The redundancy is added to only those combinations that have high probability of occurrence, while the remaining combinations are left un-protected to save area.

The work of El-Maleh et. al. "A finite state machine based fault tolerance technique for sequential circuits," Microelectronics Reliability, vol. 54, no. 3, pp. 654-661, 2014, incorporated herein by reference in its entirety, describes a fault tolerant technique for sequential circuits that enhances the reliability by introducing redundant equivalent states to the states with high probability of occurrence. Further, K. Mohanram and N. Touba describe in their work "Partial error masking to reduce soft error failure rate in logic circuits," Proceedings at 16th IEEE Symposium on Computer Arithmetic, 2003, that is incorporated herein by reference in its entirety, a partial error masking scheme based on Triple Modular Redundancy (TMR). The scheme targets the nodes with the highest soft error susceptibility. Two reduction heuristics are described to reduce soft error failure rate, namely, cluster sharing reduction and dominant value reduction. Instead of triplicating the whole logic as in Triple Modular Redundancy (TMR), only those nodes with highest soft error susceptibility are triplicated, the rest of the nodes are clustered and are shared among the triplicated logic.

Teifel proposed in his work "Self-Voting Dual-Modular-Redundancy Circuits for Single-Event-Transient Mitigation," IEEE Transactions on Nuclear Science, vol. 55, 2008, incorporated herein by reference in its entirety, a Double Modular Redundancy (DMR) scheme that utilizes voting and self-voting circuits to mitigate the effects of single event transients (SETs) in digital integrated circuits. In this work, the Bayesian detection technique from the communications theory has been applied to the voter in DIVER, called soft NMR. In most cases, it is able to identify the correct output even when all duplicated modules are in error. However, this approach has at least double the area overhead.

To protect memories and latches from soft-errors, cell hardening techniques have been described. An example of such an approach is a DICE memory cell as described by T. Calin, M. Nicolaidis, and R. Velazco, in their work "Upset hardened memory design for submicron CMOS technology," Nuclear Science, IEEE Transactions on, vol. 43, no. 6, pp. 2874-2878, December 1996, that is incorporated herein by reference in its entirety. The DICE memory cell uses twice the number of original transistors (i.e., 12 transistors as compared to 6 transistors), and has a design limitation of being able to tolerate soft errors in memory elements only and not in the combinational logic.

Soft error protection of combinational logic can be achieved by adding redundancy at the transistor-level. As described by M. Nicolaidis in "Time redundancy based soft-error tolerance to rescue nanometer technologies," in VLSI Test Symposium, 1999. Proceedings. 17th IEEE, 1999, pp. 86-94, which is incorporated herein by reference in its entirety, in such a scheme a circuit is duplicated containing all but last stage gate where the last stage gate is implemented as a code word preserving gate. The last stage gate is either a NOT, NAND or NOR gate with each transistor duplicated and connected in series to preserve the fault-free state that the output had before the transient fault occurred. Recently, the work by El-Maleh et. al. "Defect-tolerant n2-transistor structure for reliable nano-electronic designs," Computers Digital Techniques, IET, vol. 3, no. 6, pp. 570-580, November 2009, incorporated herein by reference in its entirety, describes a technique to mask defects in combinational circuits by quadrupling every transistor in a circuit, making the area overhead four times the original circuit. A quadded-transistor guarantees the tolerance of all single transistor defects and many multiple defects. In the quadded-transistor structure, each transistor, A, is replaced by a structure that implements the logic function (A+A)(A+A).

The above described protection techniques either describe a gate sizing method that protects only the sensitive gates by symmetrically sizing the NMOS and PMOS transistors, or describe an asymmetric transistor sizing technique (wherein the NMOS and PMOS transistors are sized independently of each other) while assuming that incident particle strikes only the drain of transistors connected to the output of the gate. Accordingly, a fault tolerance technique for combinational circuits is required, which protects the critical gates of the circuit while considering that particles could strike the drain terminal of any transistor of a logic gate. Moreover, in contrast to the above described works, a reliability framework for different protection thresholds, as well as a fault tolerance technique that combats the soft error occurrence problem while accounting for area overhead is required.

SUMMARY

The present disclosure provides a selective transistor-redundancy based fault tolerance technique for combinational circuits. The technique reduces the area overhead incurred due to redundancy, while providing enhanced soft error tolerance levels. The technique utilizes random pattern testability of faults in a circuit to identify gates that have high probability of fault detection at the output. Based on the fault detection probability at the output, gates are applied certain type of protections to achieve a tradeoff between area and reliability.

An aspect of the present disclosure provides for a method of providing fault tolerance in a combinational circuit. The method includes the steps of identifying a plurality of sensitive gates of the combinational circuit that require protection from at least one of a first type of fault and a second type of fault; computing by circuitry, for each first type of transistor included in the sensitive gate, a first failure probability corresponding to the first type of fault, and for each second type of transistor included in the sensitive gate, a second failure probability corresponding to the second type of fault; calculating by circuitry, a first parameter corresponding to a number of the first type of transistors for which the computed first failure probabilities exceed a first predetermined threshold and a second parameter corresponding to a number of second type of transistors for which the computed second failure probabilities exceed a second predetermined threshold; determining, based on an area overhead of the combinational circuit and the calculated first parameter and second parameter, a protection type to be assigned to the sensitive gate of the combinational circuit; and evaluating, based on the computing, the calculating, and the determining, a reliability factor of the combinational circuit.

Another aspect of the present disclosure provides for a non-transitory computer readable medium having stored thereon a program that when executed by a computer, causes the computer to execute a method providing fault tolerance in a combinational circuit. The method includes the steps of: identifying a plurality of sensitive gates of the combinational circuit that require protection from at least one of a first type of fault and a second type of fault; computing for each first type of transistor included in the sensitive gate, a first failure probability corresponding to the first type of fault, and for each second type of transistor included in the sensitive gate, a second failure probability corresponding to the second type of fault; calculating a first parameter corresponding to a number of the first type of transistors for which the computed first failure probabilities exceed a first predetermined threshold and a second parameter corresponding to a number of second type of transistors for which the computed second failure probabilities exceed a second predetermined threshold; determining, based on an area overhead of the combinational circuit and the calculated first parameter and second parameter, a protection type to be assigned to the sensitive gate of the combinational circuit; and evaluating, based on the computing, the calculating, and the determining, a reliability factor of the combinational circuit.

According to another aspect of the present disclosure is provided a device for providing fault tolerance in a combinational circuit. The device includes circuitry configured to: identify a plurality of sensitive gates of the combinational circuit that require protection from at least one of a first type of fault and a second type of fault, compute for each first type of transistor included in the sensitive gate, a first failure probability corresponding to the first type of fault, and for each second type of transistor included in the sensitive gate, a second failure probability corresponding to the second type of fault, calculate a first parameter corresponding to a number of the first type of transistors for which the computed first failure probabilities exceed a first predetermined threshold and a second parameter corresponding to a number of second type of transistors for which the computed second failure probabilities exceed a second predetermined threshold, determine based on an area overhead of the combinational circuit and the calculated first parameter and second parameter, a protection type to be assigned to the sensitive gate of the combinational circuit, and evaluate based on the computing, the calculating, and the determining, a reliability factor of the combinational circuit.

The foregoing paragraphs have been provided by way of general introduction, and are not intended to limit the scope of the following claims. The described embodiments together, with further advantages, will be best understood by reference to the following detailed description taken in conjunction with the accompanying drawings.

BRIEF DESCRIPTION OF THE DRAWINGS

Various embodiments of this disclosure that are provided as examples will be described in detail with reference to the following figures, wherein like numerals reference like elements, and wherein.

DETAILED DESCRIPTION OF EMBODIMENTS

Figure 1A:
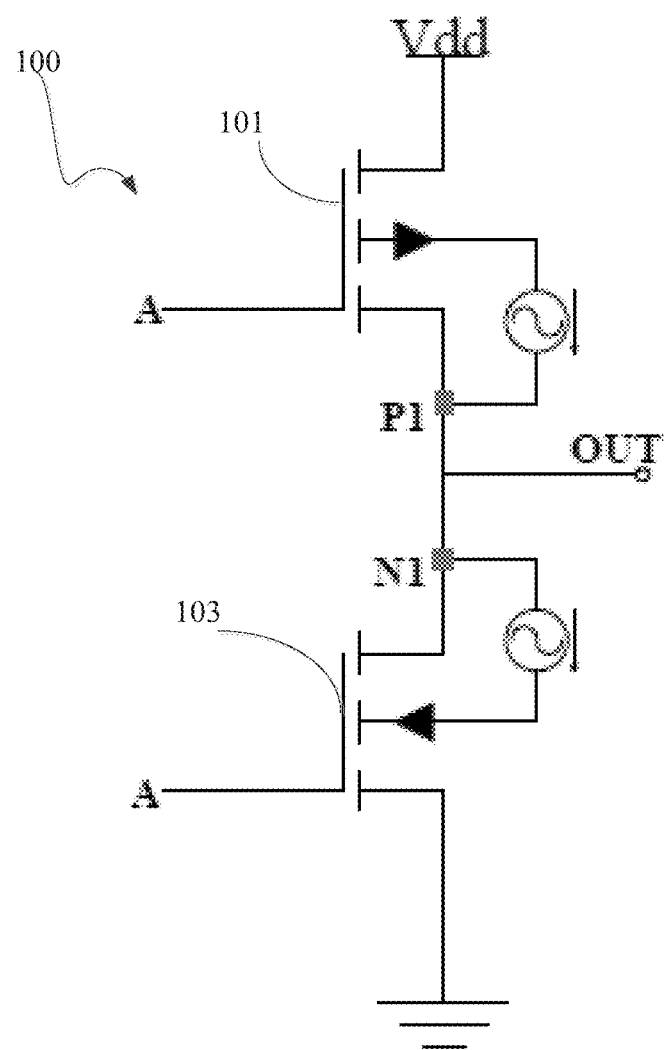
FIG. 1A depicts an exemplary inverter configuration including a PMOS transistor and an NMOS transistor.

Exemplary embodiments are illustrated in the referenced figures of the drawings. It is intended that the embodiments and figures disclosed herein are to be considered illustrative rather than restrictive. No limitation on the scope of the technology and of the claims that follow is to be imputed to the examples shown in the drawings and discussed herein.

CMOS technology is continuously improving and shrinking to the nanometer scale. High-density chips are increasingly accompanied by manufacturing defects and are susceptible to dynamic faults during the chip operation. Nanoscale devices are limited by several characteristics, most dominant of which are the device's higher defect rates and the increased susceptibility to soft errors.

Transient (soft) errors can arise due to multiple sources like high-energy particles, coupling, power supply noise, leakage and temporal circuit variations. The transient error can last for one or several clock cycles. A single event transient (SET) occurs when a charged particle hits the combinational logic, resulting in a transient current pulse. This can change the logic level of a gate. If this transient has enough width and magnitude, it can result in an erroneous value to be latched. Once it is latched, a single event transient becomes a single event upset (SEU). It must be appreciated that a single SET can produce multiple transient current pulses at the output. This is due to the logic fan-out in the circuit. Accordingly, SETs can produce multiple SEUs in the circuit nodes. The SETs as well as the SEUs can affect the reliability (defined herein as an ability of a circuit to function properly despite the existence of such errors) of a circuit, if they are not tolerated.

Although, incident alpha particles cause voltage transients, to cause soft errors these transients must also propagate through a certain path to get latched and result in soft errors. According to one embodiment, Logical masking, electrical masking and latching window masking are three types of maskings that shield the SETs from propagating to the primary outputs. Logical masking prevents the SET propagation from fault location to primary outputs of a circuit due to other gate inputs along the path that stop the propagation of the transient signal. For example, a 2-input OR (AND) gate can mask any fault in one input if the other input has a "1(0)" logic value. Electrical masking attenuates or completely masks the SET signal due to electrical properties of the gates. The voltage transient caused by a particle strike is attenuated as it propagates through a series of gates. In latching window masking, if a SET doesn't arrive on time, then it will be masked. This depends on hold and setup times of the target memory element. This is a timing related masking technique. For a voltage transient to get latched by a memory element, the pulse should be available exactly at the latching window. The transient is masked if it arrives before or after the latching window.

Turning to FIG. 1A is illustrated the selective transistor-redundancy principle by considering the effect of an energetic particle striking a CMOS inverter. FIG. 1A depicts an inverter configuration 100 including a PMOS transistor 101 and an NMOS transistor 103. When an energetic particle strikes a MOS transistor, the most sensitive regions are usually the reverse-biased p-n junctions. The incident particle ionizes the material around it, resulting in the generation of electron-hole pairs. The injected charge is transported by drift and diffusion. When the inverter input is LOW and the energetic particle strikes the drain of an NMOS transistor, the output voltage is temporarily lowered. In contrast, when the inverter input is HIGH and the energetic particle strikes the drain of a PMOS transistor, the output voltage is temporarily raised. In both cases, the output logic value of the inverter can be changed to a wrong value if enough charge is collected.

FIG. 1A illustrates the fault injection mechanism employed according to one embodiment. The output load is equal to an inverter load. The soft error is modeled by injecting a current I of charge Q at the drain of a transistor. The direction of injected current is from drain-to-body (bulk) in the NMOS transistor and from body (bulk)-to-drain in the PMOS transistor. The double exponential current pulse/is used to model the charge deposited due to a particle strike at the drain of NMOS or PMOS transistor and is expressed as:

$$I(t) = \frac{Q}{(\tau_f - \tau_r)}\left(e^{-\frac{t}{\tau_f}} - e^{-\frac{t}{\tau_r}}\right) \quad (1)$$

wherein, Q is the charge deposited by a particle strike, $\tau_f$ denotes the falling time of the pulse, $\tau_r$ denotes the rising edge of injected current pulse. Note that value of $\tau_f$ is greater than $\tau_r$. For instance, by one embodiment of the present disclosure the following values are employed for the falling time, rising edge and charge, $\tau_f$=0.2 ns, $\tau_r$=0.05 ns and the value of charge Q=0.04 pC.

Figure 1B:
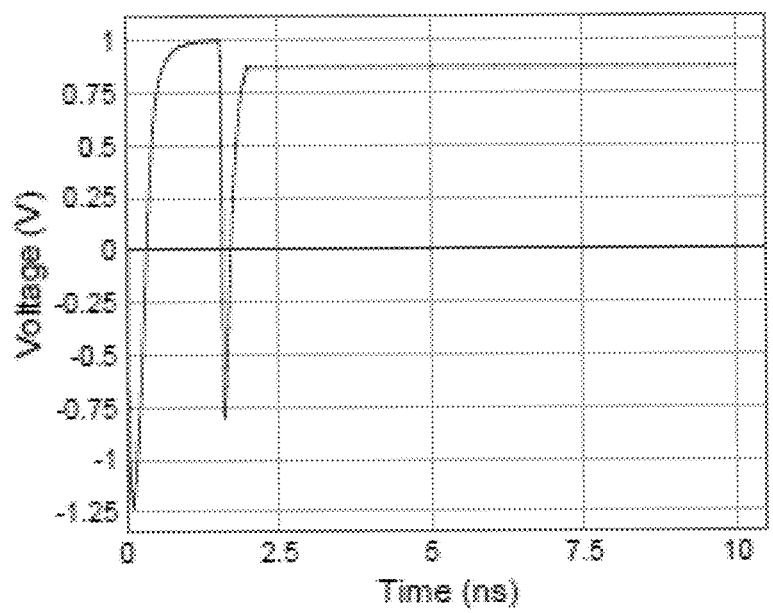
FIG. 1B depicts a graph illustrating the effect of a particle strike on the drain terminal of the NMOS transistor.

FIG. 1B illustrates the effect of particle strike on the drain of an NMOS transistor when the true output of an inverter is HIGH. The particle strike at N1 will cause a sudden drop in the output voltage (up to ≈−0.72 v) of inverter. This type of soft error will be modeled as a stuck-at-0 fault (sa0) at the output of the gate. To protect from this fault, the PMOS transistors of an inverter must be scaled enough so that output voltage becomes >VDD/2.

Figure 1C:
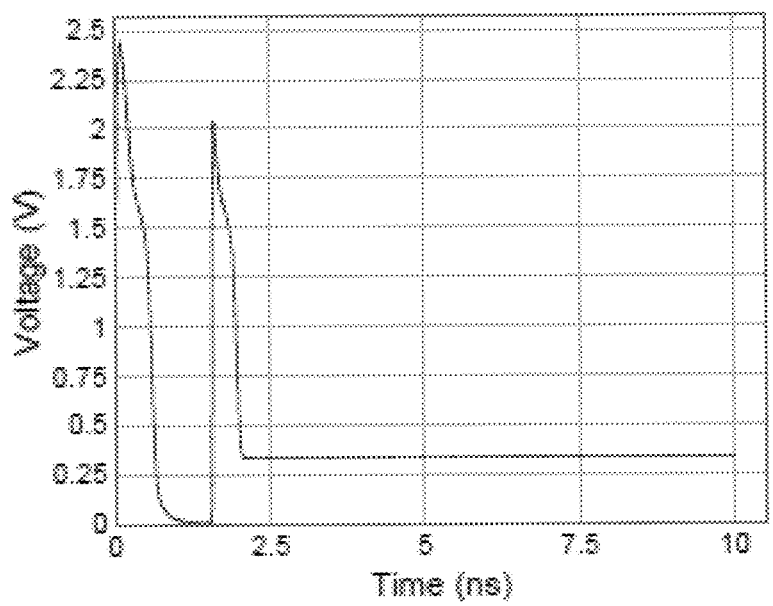
FIG. 1C depicts a graph illustrating the effect of a particle strike on the drain terminal of the PMOS transistor

FIG. 1C illustrates the effect of particle strike on the drain of a PMOS transistor when the true output of an inverter is LOW. The particle strike at P1 will cause a sudden rise in the output voltage (up to ≈2 v) of inverter. This type of soft error will be modeled as a stuck-at-1 fault (sa1) at the output of the gate. To protect from this fault, the NMOS transistors of an inverter must be scaled enough so that output voltage becomes <VDD/2.

Figure 2A:
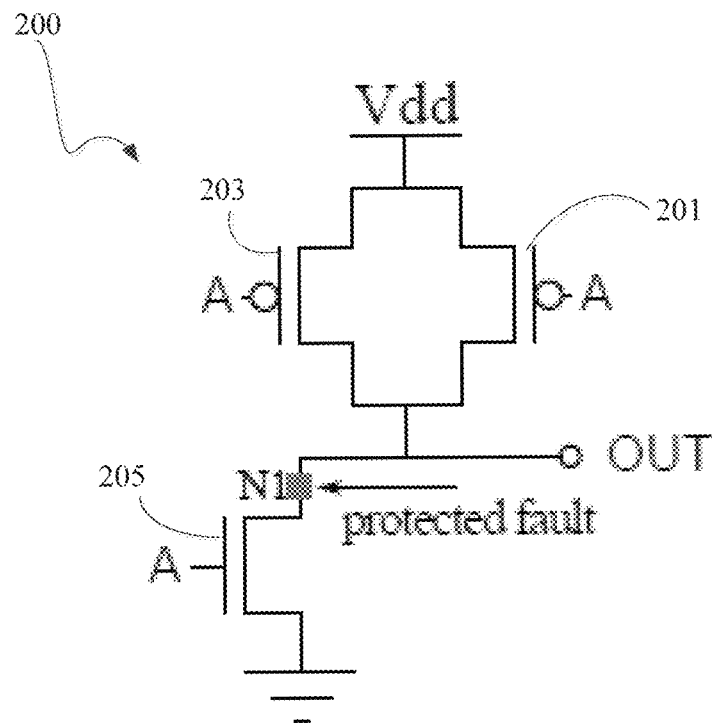
FIG. 2A illustrates according to one embodiment, an exemplary transistor arrangement.
Figure 2B:
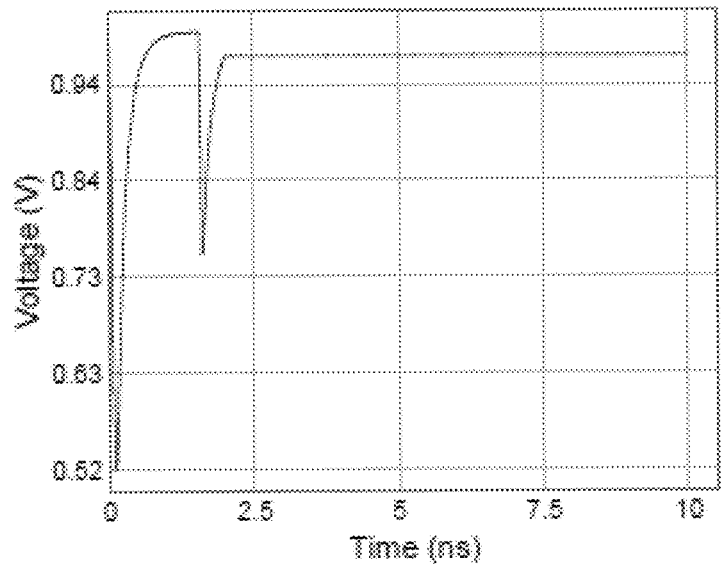
FIG. 2B depicts a graph illustrating the effect of a particle strike on the drain terminal of the NMOS transistor in FIG. 2A.

FIG. 2A illustrates according to one embodiment, a transistor arrangement 200 that includes PMOS transistors 201 and 203 that are connected (with respect to each other) in parallel fashion. The combination of the PMOS transistors 201 and 203 is connected as shown in FIG. 2A to an NMOS transistor 205. If the output (of the circuit 200) is currently high and an energetic particle hits the drain N1 of the NMOS transistor (with the same current source used in the scenario depicted in FIG. 1A), results in a lowered voltage observed at the output. However, due to the employed transistor configuration, the net negative voltage effect is compensated as shown in the graph depicted in FIG. 2B. Specifically, the arrangement of transistors as shown in FIG. 2A, results in a spike that has a lesser magnitude as compared to the spike in the output voltage as shown in FIG. 1B. By one embodiment, the spike magnitude is reduced due to increased output capacitance, reduced resistance between VDD and the output. The structure used for protecting against this type of soft error provides protection against any single stuck-short fault at the NMOS transistor.

Figure 2C:
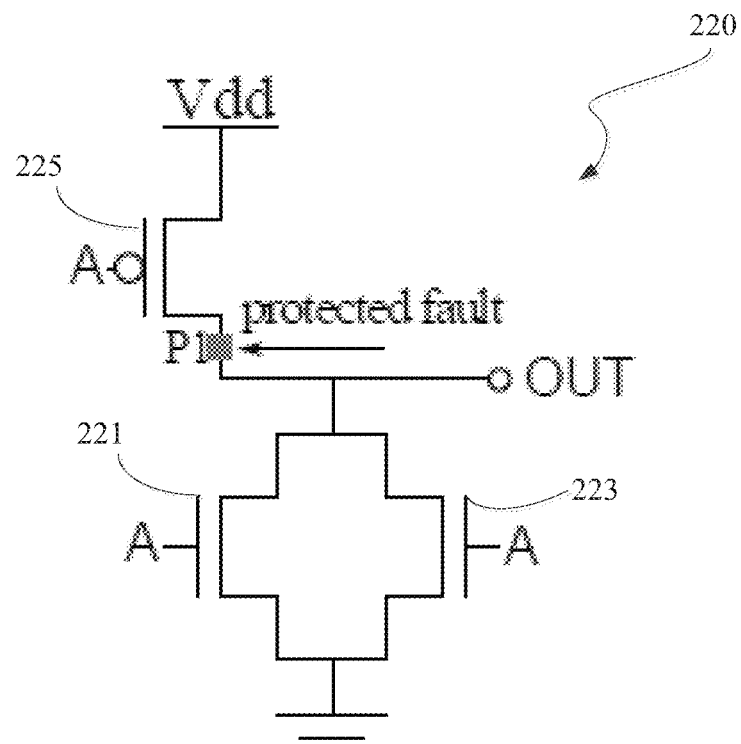
FIG. 2C illustrates according to one embodiment, an exemplary transistor arrangement.
Figure 2D:
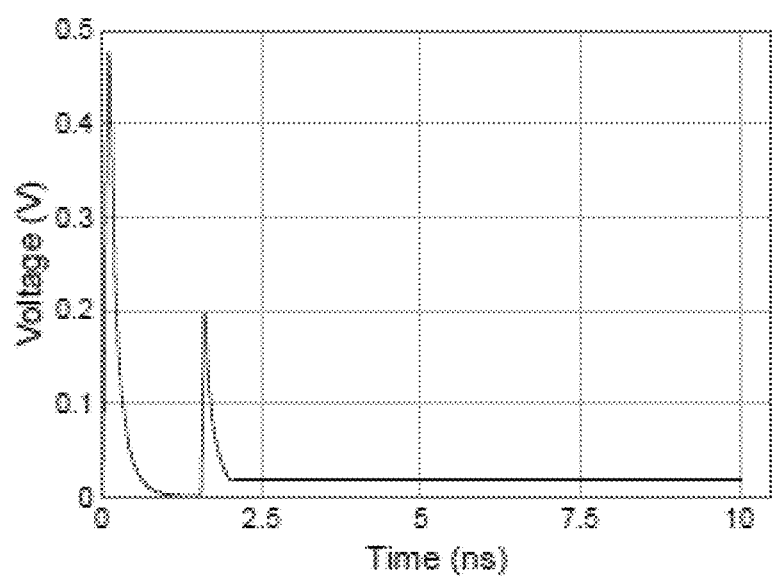
FIG. 2D depicts a graph illustrating the effect of a particle strike on the drain terminal of the PMOS transistor in FIG. 2C.

Turning to FIG. 2C is depicted another arrangement of transistors 220, wherein redundant NMOS transistors 221 and 223 are connected in a parallel fashion. The combination of the NMOS transistors 221 and 223 is connected serially to a PMOS transistor 225. If the output of the circuit 220 is low, and the incident energetic particle strikes the drain P1 of the PMOS transistor, then the raised voltage effect at the output (as compared to the output as shown in FIG. 1C) is reduced as illustrated in FIG. 2D. The reduction in the spike magnitude is due reasons similar to those stated above with reference to FIG. 2B. The structure 220 used for protecting against this type of soft error also provides protection against any single stuck-short fault at the PMOS transistor.

According to one embodiment, in order to protect from both sa0 and sa1 faults, the transistor structures in FIG. 2A and FIG. 2A can be combined to fully protect a "NOT" gate. A fully protected "NOT" gate has 2 NMOS and 2 PMOS transistors connected in parallel to each other. Thus, such a structure is referred to as a "Double" transistor structure. It must be appreciated that the "Double" approach offers best hardening by design (i.e. protection), but at the cost of a higher area overhead and power.

By one embodiment, providing redundancy alone may not be sufficient to fully suppress the effect of a particle strike at the drain of a transistor. The width of the redundant transistor(s) must also be increased to allow dissipation (sinking) of the deposited charge as quickly as it is deposited so that the transient doesn't achieve sufficient magnitude and duration to propagate to the output. Note that introducing redundancy and sizing among the transistors will also increase the overall area of the gate, and although, increasing the area of a gate increases its exposure to particle strikes, the added drive and capacitance eliminate failure due to these strikes. The optimal size of the transistor for SEU immunity depends on the charge Q of the incident energetic particle. Sizing the gate to protect from SEU with a particular charge Q, makes the failure probability of that gate to zero, and therefore, the particular gate does not contribute to the overall failure rate of the circuit.

In what follows, is described two transistor sizing techniques by one embodiment of the present disclosure. The first technique protects sensitive gates of the circuit that have fault detection probability greater than a predefined threshold. The second technique protects the sensitive gates of the combination circuit until an area overhead constraint is achieved. The techniques described herein significantly reduce the soft error rate of the circuit with a minimal area overhead.

The first technique of protecting the sensitive gates of the combination circuit is referred to herein as a selective transistor-redundancy (STR) technique. The STR technique is based on analyzing a random pattern testability of stuck-at-faults at the gate outputs. By one embodiment, based on the probability of fault detection (i.e., stuck-at-0 or stuck-at-1) at a gate's output, four kinds of protections can be applied: 1) protection from both stuck-at-0 and stuck-at-1 faults, 2) protection from stuck-at-1 fault, 3) protection from stuck-at-0 fault, 4) no fault protection.

In addition to scaling the width of redundant transistors, gates that require protection for both stuck-at-0 and stuck-at-1 faults are implemented at the transistor level by doubling each transistor i.e., each transistor will be replaced by a two transistor parallel structure. However, gates that require protection from a single type of fault are implemented at the transistor level by doubling either the NMOS or the PMOS transistor(s), depending on the type of fault to protect. Further, gates that require no protection are implemented at the transistor level as normal gates. Accordingly, in this technique of providing protection, there will be an area overhead tradeoff, wherein gates that need protection for both types of faults will have an area size that is two times the normal implementation (i.e., circuit without protection), whereas gates that need protection for a single type of fault will have an area size that is 1.5 times the normal implementation, and gates with no protection will have no area overhead. It must be appreciated that the above stated area overhead may be in terms of the number of transistors and/or the cumulative drain area of all transistors. Furthermore, the cumulative drain area is a function of the number of transistors and the scaling required by each transistor in order to suppress a transient of a certain charge Q.

According to one embodiment, the STR technique is applied to the critical nodes (also referred to herein as sensitive nodes) of a circuit. Critical nodes of a combinational circuit are nodes that have a high probability of fault detection and are identified by one embodiment, based on a fault simulation of predetermined number (e.g., one million) random input patterns. Once the critical nodes are identified, the nodes can me marked with a protection type to be applied. Thereafter, the gate-level circuit is converted to a transistor-level netlist that includes PMOS and NMOS transistors with redundancy applied at the transistor-level only. In this realm, different arrangements of PMOS and NMOS transistors for each gate are described later with reference to FIGS. 4A-4E.

Figure 3:
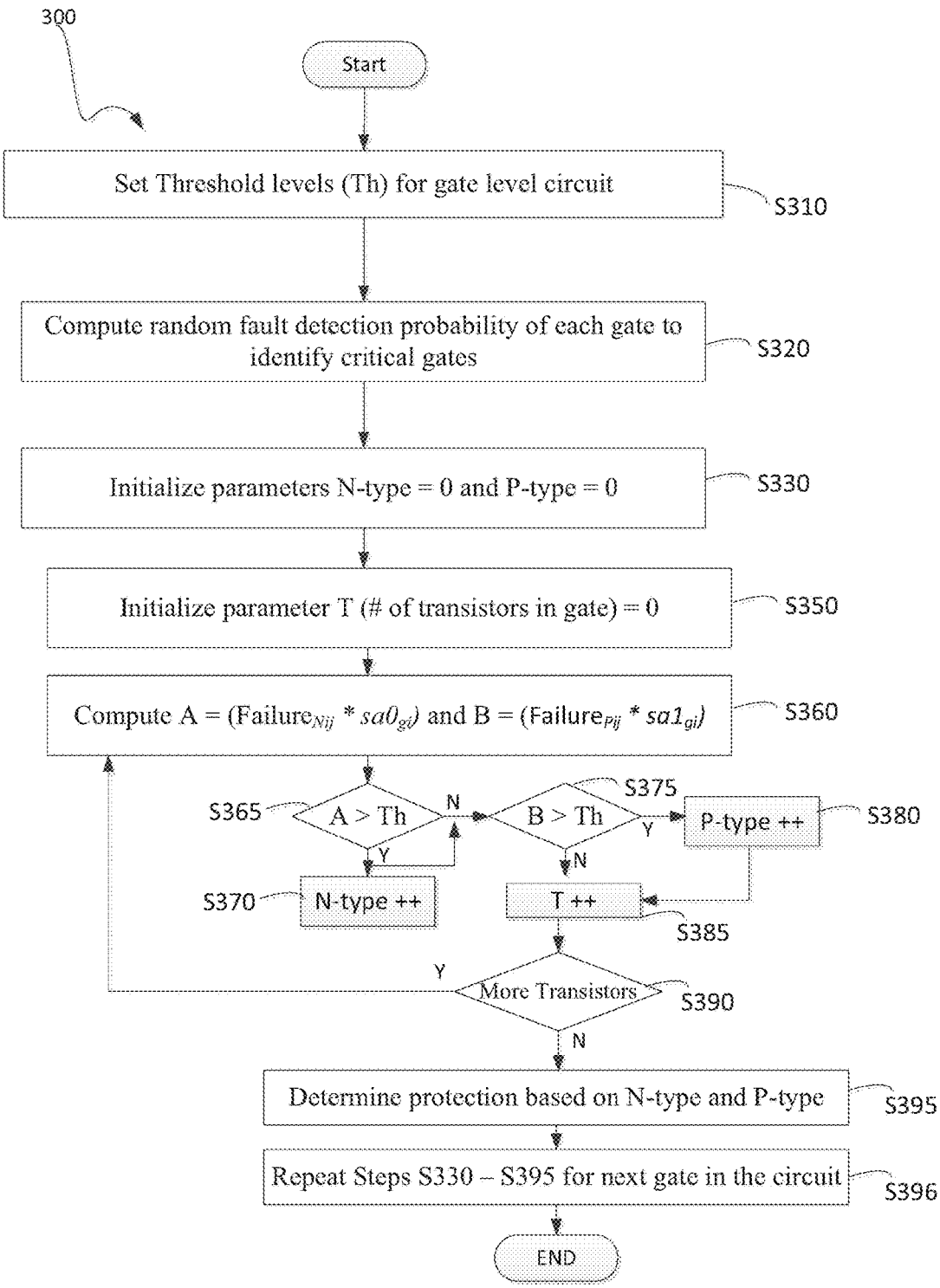
FIG. 3 depicts a flowchart illustrating the steps performed to provide protection.
Figure 12:
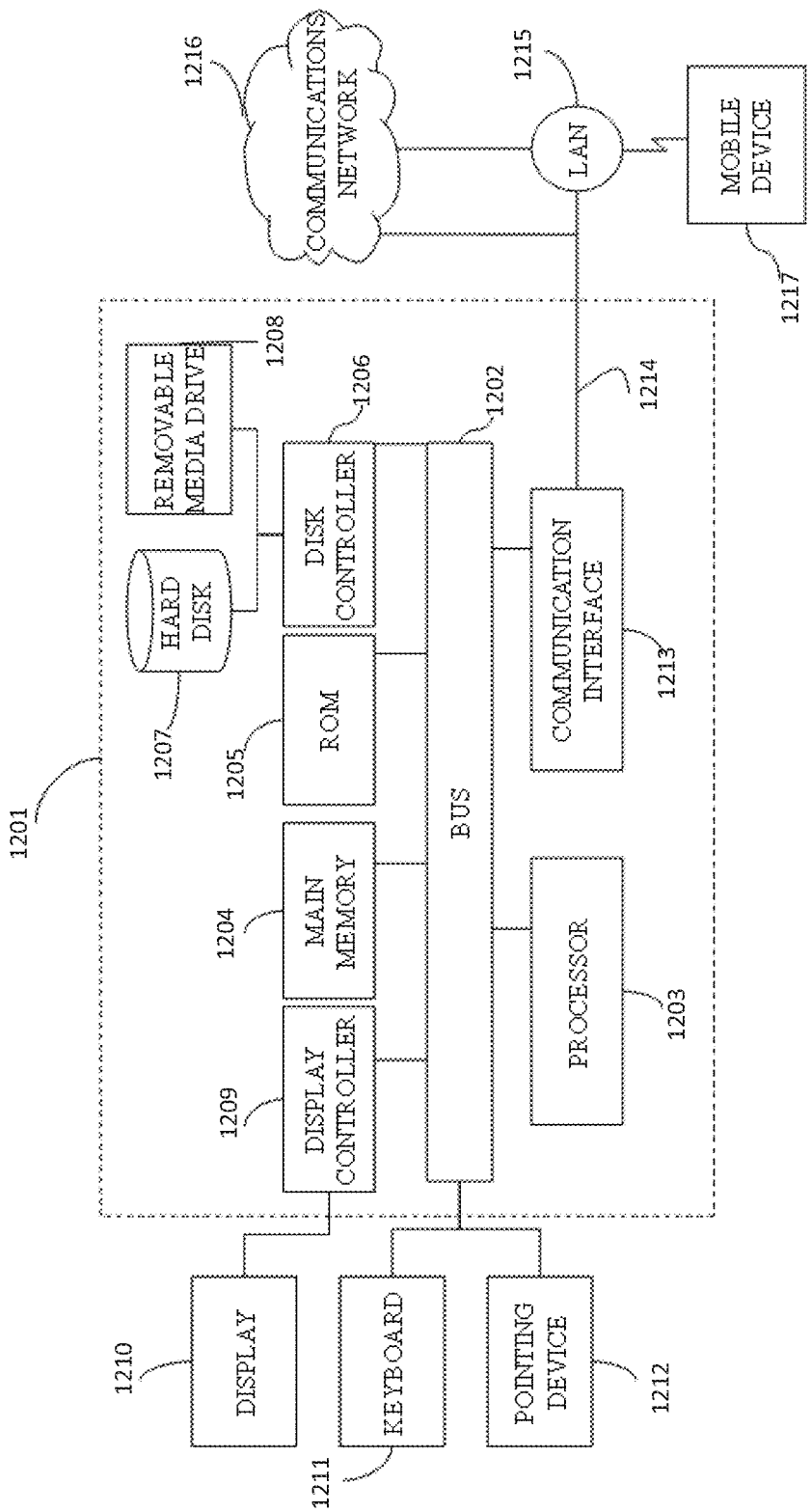
FIG. 12 illustrates an exemplary block diagram of a computing device.

Turning now to FIG. 3 is illustrated a flowchart depicting the steps performed to provide protection by the STR technique. It must be appreciated that the process as illustrated in FIG. 3 may be performed by a processor (described later with reference to FIG. 12). A key component of the STR technique is to scale the probability of failures of each NMOS and PMOS transistor of a gate to their respective stuck-at-zero (sa0) and stuck-at-one (sa1) fault detection probabilities.

Based on the scaled fault detection probability of the transistor being greater than a threshold Th, the sao (sa1) transient fault on that transistor are protected by duplicating and scaling the PMOS (NMOS) transistor(s). The computation of failure probability of a transistor is discussed below. Furthermore, in the flowchart of FIG. 3, the variables $Failure_{Nij}$ or $Failure_{Pij}$ denote the failure probability at the output of a gate if an incident particle strikes the drain of NMOS or PMOS transistor of that gate. Scaling failure probability of a gate with stuck-at fault detection probability quantifies the failure probability of that gate at the primary output for a particular charge value. Additionally, the protection threshold Th may take values between [0%, 100%] and represents the protection from faults having detection probability greater than or equal to 1-Th. For instance, protection threshold of 99% implies the protection of all faults with detection probability greater than or equal to (1−0.99)=0.01. Thus, increasing Th will result in more gates to be protected, and vice versa.

The process in FIG. 3 commences in step S310 wherein a threshold level (Th) for each gate in the combinational circuit is set In step S320, random fault detection probabilities of each gate computed. Specifically, the stuck-at-0 and stuck-at-one fault detection probabilities of each gate in the combinational circuit are computed to determine the sensitive gates in the circuit. The sensitive gates in the circuit correspond to gates that require at least one of the four above described protection mechanisms. By one embodiment, the fault detection probabilities of the gate can be determined by using a fault simulator.

Further, in step S330, the parameters N-type and P-type are initialized to zero. The parameter N-type is a variable that is used to determine a protection type from sa0 faults that is to be applied to the gate, whereas the parameter P-type is a variable that is used to determine a protection type from sa1 faults that is to be applied to the gate.

In step S350, the parameter T (counter for the number of transistors in the gate under consideration) is initialized to zero.

Further, the process in step S360 computes for each transistor of the gate under consideration a scaled fault detection probability. Specifically, for the NMOS (PMOS) transistor, the scaled fault detection probabilities of $A=\text{Failure}_{Nij}*\text{sa0}_{gi}$ and $B=\text{Failure}_{Pij}*\text{sa1}_{g}$, are computed.

The process the proceeds to step S365 wherein a query is made to determine whether the parameter A (corresponding to scaled fault detection probability of NMOS transistor) is greater than a predetermined threshold (Th). If the response to the query is affirmative, the process moves to step S370. If the response to the query is negative, the process proceeds to step S375.

In step S370, the variable N-type is incremented by one. The process the proceeds to step S375. In step S375, a query is made to determine whether the parameter B (corresponding to scaled fault detection probability of PMOS transistor) is greater than a predetermined threshold (Th). If the response to the query is affirmative, the process moves to step S380. If the response to the query is negative, the process proceeds to step S385.

In step S380, the variable P-type is incremented by one, whereafter the process proceeds to step S385. In step S385, the counter value of the number of transistors (T) is incremented by one, whereafter the process moves to step S390.

In step S390, a query is made to determine whether the gate under consideration has additional transistors that are to be evaluated. If the response to the query is affirmative, the process loops back to step S360 and repeats the process described in S360-S390 for the next transistor. If the response to the query is negative, the process proceeds to step S395.

In step S395, a protection mechanisms (described next with reference to FIGS. 4A-4E) based on the values of the N-type and P-type parameters is determined for the gate under consideration. Further, the process proceeds to step S396 wherein the process of steps S330-S395 are repeated for next gate in the circuit. Once all the gates of the combinational circuit have been processed in the manner as described in FIG. 3, the process of FIG. 3 terminates.

Turning to FIGS. 4A-4E are illustrated CMOS implementations 410-450 of a 2-input NAND gate. According to one embodiment, a library including a 2-input, 3-input and a 4-input NAND and NOR gates as well as inverters is considered. For sake of simplicity, in FIGS. 4A-4E, the case of a 2-input NAND gate is described. It must be appreciated that the STR technique of FIG. 3 can be extended for the NOR gates, 3-input, 4-input configurations and the like.

Figure 4A:
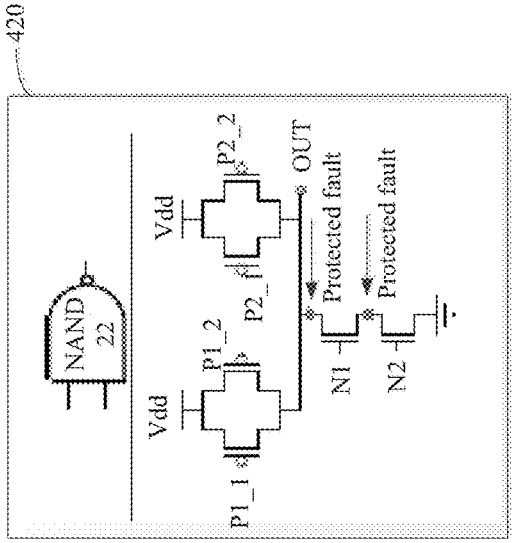
FIGS. 4A-4E illustrate CMOS implementations of a 2-input NAND gate.

In CMOS implementation of NAND21 410 (as shown in FIG. 4A), PMOS transistor P1 is duplicated and connected in parallel to protect a fault that hits the drain of NMOS transistor N1. If current gate g, is a NAND gate and the condition for the parameter N-type is satisfied for N1 transistor only, then, this will increment the value of N-type to 1 and the protection type NAND21 will be applied to that gate.

Figure 4B:
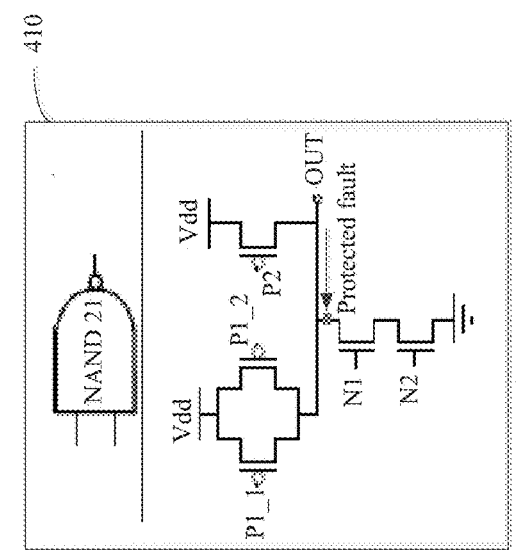
Figure 4C:
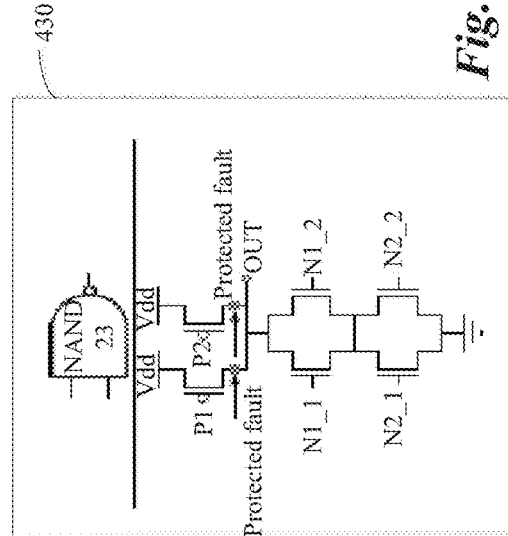

Similarly, if the condition (step S365 and step S375) is satisfied for both NMOS transistors N1 and N2, then both PMOS transistors will be duplicated to protect from faults that can occur at the drain of NMOS. Hence, protection type for that gate will be NAND22 as shown in FIG. 4B. In a similar manner, protection from sa1 faults in NOR gates can be applied.

Figure 4D:
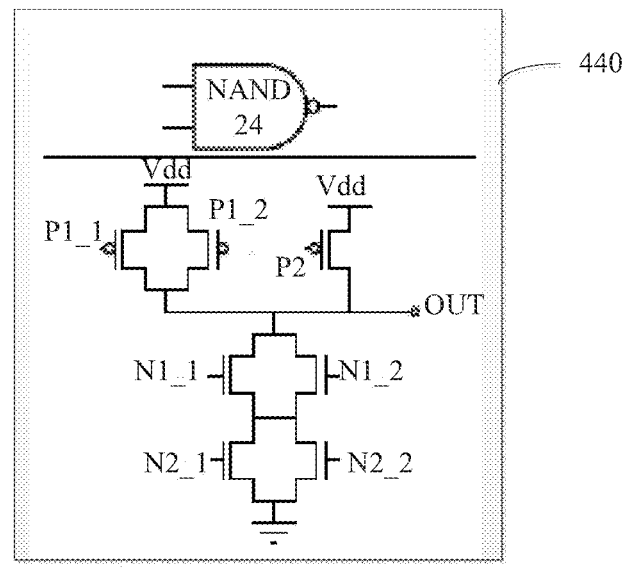
Figure 4E:
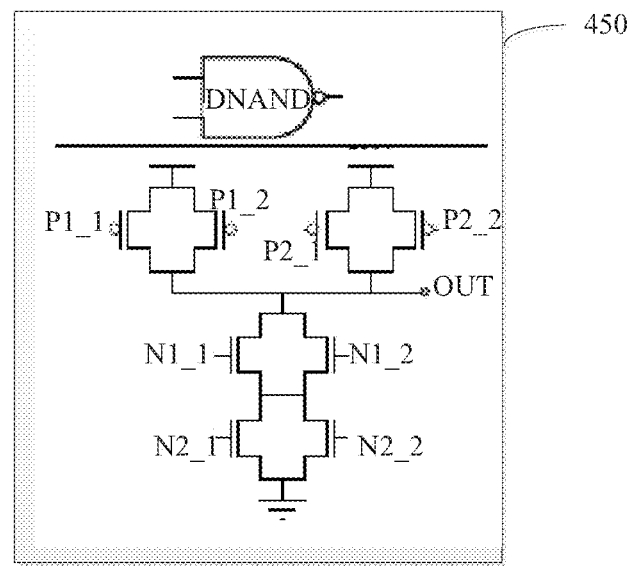

To protect from sa1 faults, all the NMOS transistors are duplicated. The 2-input, 3-input and 4-input NAND (NOR) gates are marked with NAND23 (NOR23), NAND34 (NOR34) and NAND45 (NOR45) to protect them from sa1 (sa0) faults by duplicating and scaling all NMOS (PMOS) transistors. As shown in FIG. 4D, NAND24 provides protection from faults that can occur at any of the PMOS transistors or at the NMOS transistor N1. In the case when both sa0 and sa1 fault detection probability of a gate is greater than the threshold Th, then the NAND gate will be marked as a double NAND gate i.e., DNAND at the gate level (as shown in FIG. 4E). It must be appreciated that the DNAND gate will be subsequently implemented at the CMOS level where all NMOS and PMOS transistors are duplicated and connected in parallel, as shown in FIG. 4E.

Figure 5:
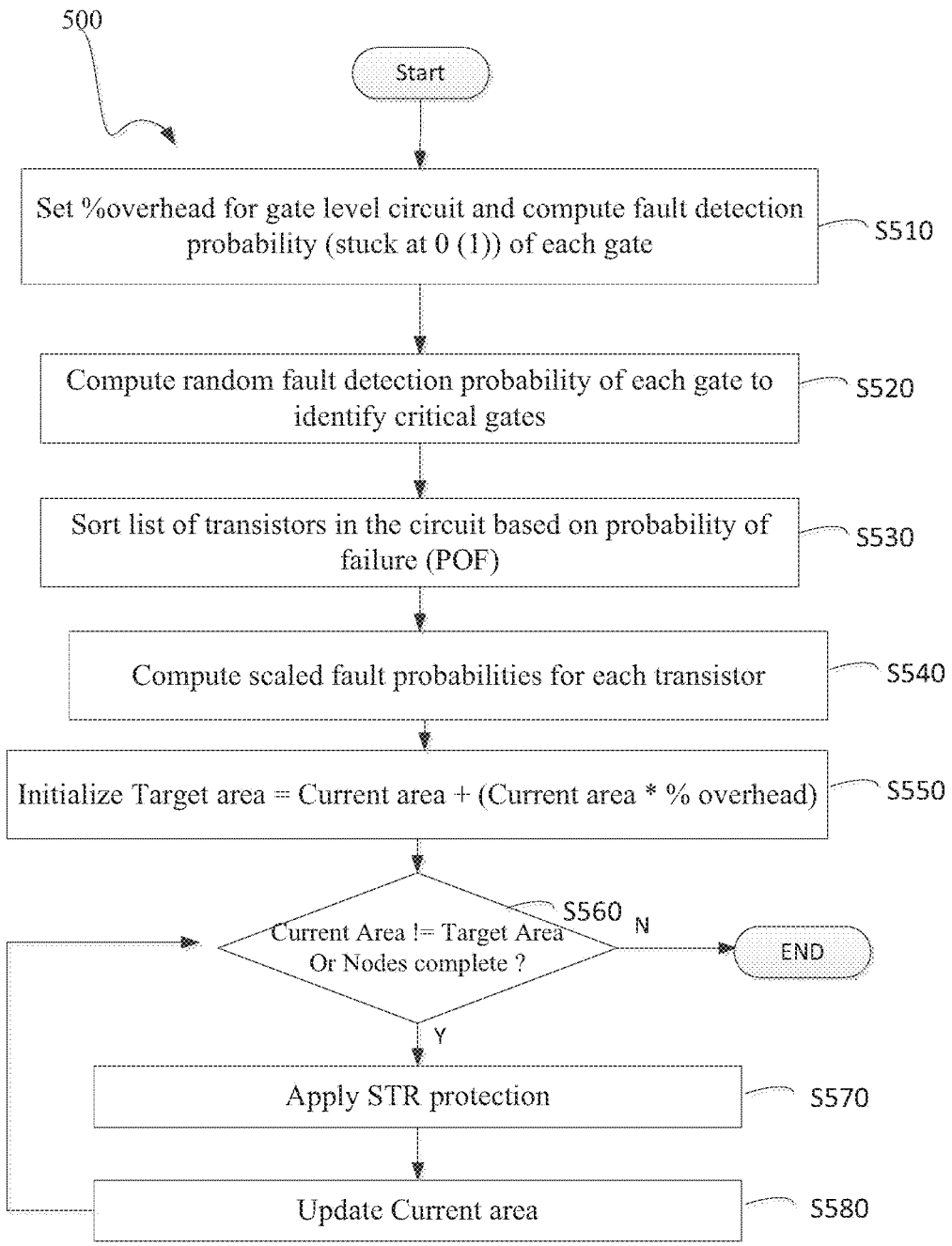
FIG. 5 depicts a flowchart illustrating the steps performed to provide protection based on an area overhead constraint.

FIG. 5 depicts a flowchart 500 illustrating the steps performed to provide protection based on an area overhead constraint. The process as illustrated in FIG. 5 is similar to the process of FIG. 3, with the additional constraint of considering an area overhead (set in step S510) while providing protection to the gates of the combinational circuit. Accordingly, in the following description, for the sake of simplicity, only the differences between the process of FIG. 5 and FIG. 3 are described.

Specifically, the process as illustrated in FIG. 5 successively applies the STR technique (FIG. 3) to the most sensitive nodes of the circuit until the required area overhead is achieved or all the sensitive nodes have been processed (as depicted in step S560). Additionally, the transistors of the combinational circuit are sorted in a decreasing order of their probability of failure (POF). Each time, a transistor is processed for suitable protection, the area overhead condition is determined in step S560. If there is sufficient area to be assigned for the protection, the process provides fault protection in a manner similar to that as described previously in FIG. 3. Each time a transistor is provided a fault tolerance mechanism, the current area (initially assigned the value of the area of the combinational circuit plus the percentage overhead) is updated as shown in step S580. Specifically, by one embodiment, upon providing fault protection to the transistor, the additional area (used by the additional transistors that provide fault protection) is added to the current area of the combinational circuit. Upon determining the condition in step S560 (i.e., the area overhead condition being violated or all the gates in the combinational circuit being processed) the process in FIG. 5 terminates.

Figure 6:
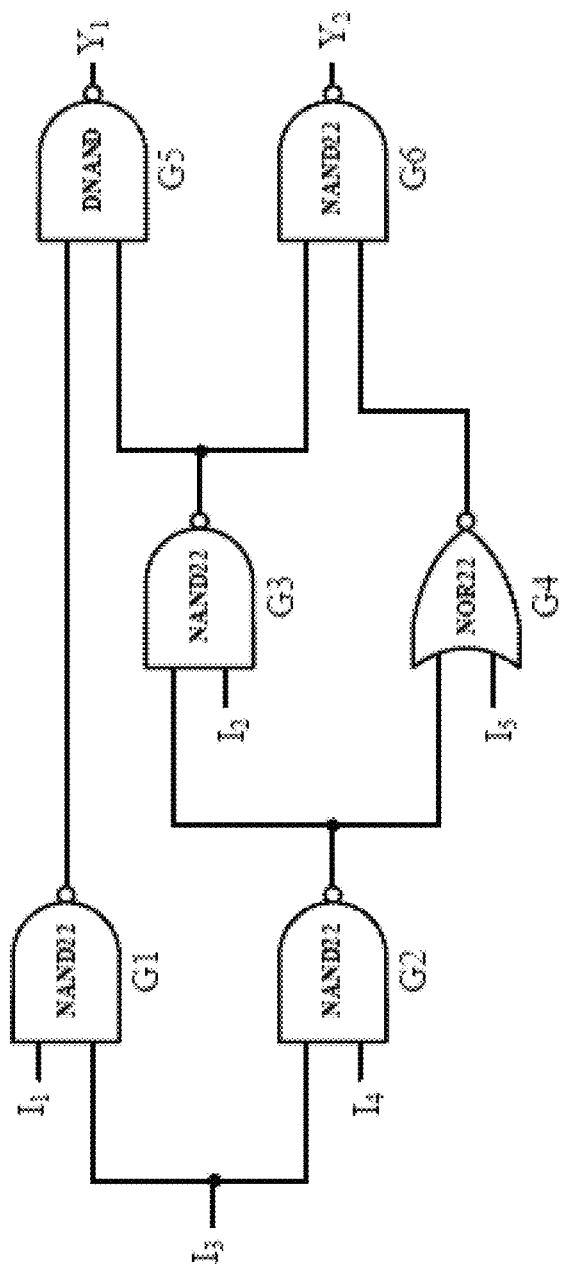
FIG. 6 depicts an exemplary example elaborating the application of the selective transistor redundancy protection scheme.

FIG. 6 depicts an exemplary example elaborating the application of the selective transistor redundancy scheme described in FIG. 3. It must be appreciated that the same concept can be extended for STR based on area constraint (FIG. 5). FIG. 6 depicts a benchmark circuit (referred to as a c17 test circuit), which includes 5 inputs, 2 outputs, 5 NAND and one NOR gate. Table II shown below depicts the fault detection probabilities of all gates in the circuit.

TABLE I stuck at fault detection probabilities of gates of the c-17 circuit.

| Gate | Stuck-at-0 Prob. | Stuck-at-1 Prob. |
|------|------------------|------------------|
| G1   | 0.43             | 0.19             |
| G2   | 0.52             | 0.15             |
| G3   | 0.5              | 0.31             |
| G4   | 0.12             | 0.5              |
| G5   | 0.56             | 0.43             |
| G6   | 0.88             | 0.12             |

Applying a protection threshold of 97% i.e., gates will protected only for those faults that have stuck-at fault detection probability greater than or equal to [1−97%]=0.03, and that satisfy one or both of the conditions of the scaled probabilities exceeding the predetermined thresholds, the following protection scheme can be provided for the c-17 circuit.

Consider gate G1 with Area=2×0.18=0.54, the sa0 failure probabilities of two NMOS transistors, are $$\frac{\frac{0.75}{1} \times 0.09}{0.54} = 0.125 \text{ and } \frac{\frac{0.5}{1} \times 0.09}{0.54} = 0.083,$$

respectively. The computations of the sa0 probabilities are described later with reference to FIGS. 7B and 7C. With threshold Th=0.03 and sa0 detection probability of G1=0.43 from Table I, the scaled probability condition is satisfied for both N1 i.e., (0.125×0.43>0.03)⇒(0.054>0.03) and N2 i.e., (0.083×0.43>0.03)⇒(0.037>0.03).

Similarly, the sa1 failure probability of two PMOS transistors, is $$\frac{\frac{0.25}{1} \times 0.18}{0.54} = 0.083,$$

and the scaled probability condition i.e., (0.083×0.19>0.03) 0.02>0.03 is not satisfied. Therefore, the gate G1 will be protected only for sa0 faults i.e., the fault that occurs at N1 or N2, hence marked as "NAND22".

For gate G4, the sa1 failure probability of the two PMOS transistors P1 and P2 are $$\frac{\frac{0.75}{1} \times 0.18}{0.54} = 0.25 \text{ and } \frac{\frac{0.75}{1} \times 0.18}{0.54} = 0.25,$$

respectively. The scaled probability condition is satisfied for both P1 and P2 i.e. (0.25×0.5>0.03)=(0.125>0.03). Similarly, the sa0 failure probability of two NMOS transistors is $$\frac{\frac{0.25}{1} \times 0.09}{0.54} = 0.042,$$

and the scaled probability condition i.e., (0.042×0, 0.12>0.03)⇒(0.005>0.03), is not satisfied for both of them. Therefore, the gate G4 will be protected only for sa1 faults i.e., the fault that occurs at P1 or P2, hence marked as "NOR22". Additionally, gate G5 is protected from both sa0 and sa1 faults and marked as "DNAND" because it satisfies both protection conditions for all its NMOS and PMOS transistors.

In what follows, a framework to compute the reliability (defined herein as the ability of the combinational circuit to function properly despite the existence of soft errors) of the combinational circuit is first described with reference to FIG. 7A, followed by a exemplary framework (FIGS. 7B and 7C) to compute the probability of failures of the gates of the combinational circuit.

According to one embodiment, the proposed reliability computation technique bridges the gap between circuit level simulations performed in SPICE (simulation program with integrated circuit emphasis) and the gate level simulations, which could be performed by a gate-level simulator. Simulations performed at the gate level make an underlying assumption that the effect of a transient fault results in a bit flip at the output of a gate or in the memory. However, this assumption doesn't capture the true nature of transient fault effect. An occurrence of a transient fault at the drain of an NMOS or PMOS transistor can affect not only the target transistor, but it might also affect the other transistors in nearby location. Accordingly, by one embodiment of the present disclosure, two measures 1) probability of fault injection and 2) probability of gate failure are considered. Probability of fault injection, computed using SPICE, quantifies the probability with which a fault must be injected at the gate level so that SPICE level and gate level simulation results are highly matched. Probability of failure denotes the overall failure probability of a gate and is partially based on probability of fault injection.

Figure 7A:
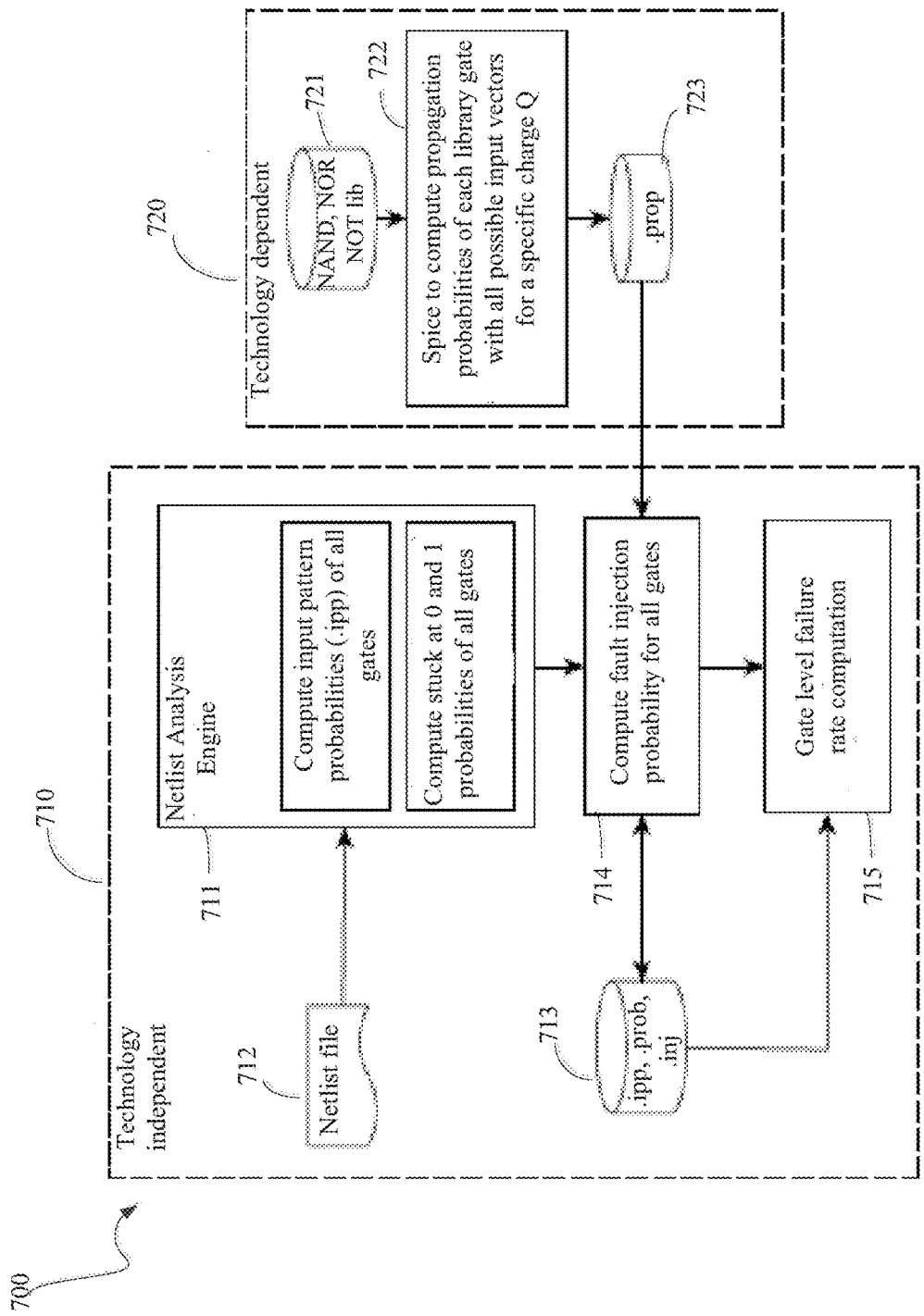
FIG. 7A depicts an exemplary reliability evaluation framework.

FIG. 7A depicts an exemplary reliability evaluation framework 700. The reliability evaluation framework 700 includes of two major blocks: a technology independent block 710, and a technology dependent block 720. The purpose of technology independent block 710 is to analyze a given benchmark circuit to compute three important parameters for all gates: a) input pattern probability (.ipp), b) stuck-at detection probability (.prob), and c) fault injection probability (.inj) that are stored in database 713.

The input pattern probability of a gate contains the logic valued patterns that could occur at the input of a gate along with their frequencies. Stuck-at fault probabilities are computed by performing simulation for instance, of one million random test vectors using the parallel fault simulator (Hope) as described by H. K. Lee and D.-S. Ha, in "Hope: An efficient parallel fault simulator for synchronous sequential circuits," Computer-Aided Design of Integrated Circuits and Systems, IEEE Transactions on, vol. 15, no. 9, pp. 1048-1058, September 1996, incorporated herein by reference in its entirety. The fault injection probability denotes the probability with which a fault must be injected at the gate-level.

The technology dependent portion of the framework 720 includes the library gates of any a predetermined number of inputs. For instance, by one embodiment, the library may include 2-input, 3-input and 4-input NAND/NOR gates and an inverter 721. The purpose of this block is to observe the behavior of different process technologies, like 45 nm, 32 nm to name a few, against a specific charge value. The block 720 computes the effect of induced current of a charge (Q) for every transistor of a library gate. The results of such computations are further save in the propagation (.prop) file 723. It must be appreciated that one can compute and save the behavior of different technologies against different charge (Q) values, and that such a computation is performed only once 722.

Further, the fault injection probability 714 of a gate in the circuit can be computed for any process technology from the technology dependent part 720. Once the fault injection probabilities are computed, the gate-level failure rate computations 715, discussed next with reference to FIG. 10 can be employed to evaluate the circuit. It must be noted that, the initial analysis of a circuit is performed only once, and takes by one embodiment, an average 30 minutes to generate all the required parameters. Note that, if there is a change in the circuit, then the analysis has to be repeated as well.

According to one embodiment, the sa0 fault injection probability of a gate is computed using the following equation:

$$sa0\ inj.\ Prob = \sum_{i=1}^{n} Propagation_{Ni} \times \frac{\lambda NW_i}{\sum_{i=1}^{n} \lambda NW_i} \quad (2)$$

wherein, n is the total number of NMOS transistors, A is the required scaling factor of the i-th NMOS transistor, $NW_i$ is the width of NMOS transistor N1 and the parameter Propagation$_{N1}$ denotes the probability with which fault is propagated to the output of a gate if a transient fault impinges the drain of Ni-th NMOS transistor. Note that for a value of λ=1, the gates that require no protection.

Similarly, the sa1 fault injection probability of a gate is computed as follows:

$$sa1\ inj.\ Prob = \sum_{i=1}^{P} Propagation_{Pi} \times \frac{\lambda PW_i}{\sum_{i=1}^{n} \lambda PW_i} \quad (3)$$

wherein p is the total number of PMOS transistors, λ is the required scaling factor of the i-th PMOS transistor, $PW_i$ is the width of PMOS transistor Pi and the parameter Propagation$_{Pi}$ denotes the probability with which fault is propagated to the output of a gate if the transient hits the drain of i-th PMOS transistor. Besides $NW_i$ and $PW_i$, the Propagation probability of any MOS transistor depends on the process technology and the charge of the incident particle. Therefore, by one embodiment, in order to get the exact Propagation probability of each MOS transistor, SPICE level simulations may be used.

The Propagation$_i$ of i-th transistor of a gate can be derived as follows. Let S be a set of patterns for which an error is propagated to the output, and M be the sum of probability of occurrence of patterns that produce logic "1(0)" as an output, then Propagation$_i$ can be defined as:

$$Propagation_i = \sum_{j=1}^{|S|} \frac{Prob.\ S_j}{M} \quad (4)$$

wherein, $$M = \sum_{i=1}^{|S|} S_j.$$

Note that for sa0 faults, M will be the sum of probabilities of occurrence of input patterns that produce logic "1" at the output, whereas, for sa1 faults, M will be the sum of probabilities of occurrence of input patterns that produce logic "0" as an output.

By one embodiment of the present disclosure, the theoretical probability of failure of a gate is obtained by combining probability of failure for sa0 and sa1 faults. The sa0 failure probability is computed using the following relation:

$$sa0\ \text{failure}\ Prob. = \sum_{i=1}^{n} Failure_{N1} \times \frac{\lambda NW_1}{Area} \quad (5)$$

wherein, n is the total number of NMOS transistors, Failure$_{Ni}$ denotes the failure probability of the i-th NMOS transistor, $NW_i$ is the width of NMOS transistor i, λ is the required scaling factor of the i-th NMOS transistor, Area is the area of a gate obtained by summing the widths (with or without scaling λ) of all NMOS and PMOS transistors. Note that for a value of λ=1, the gates require no protection. It must be appreciated that the difference between the parameter Propagation$_i$ in Eqns. (2) and (3) and the parameter failure probability Failure$_i$ is that Failure$_i$ is computed by applying all the input combinations.

Similarly, the sa1 failure probability is computed as follows:

$$sa0\ \text{failure}\ Prob. = \sum_{i=1}^{p} Failure_{P1} \times \frac{\lambda PW_1}{Area} \quad (6)$$

wherein, p is the total number of PMOS transistors, Failure$_{Pi}$ denotes the failure probability of the i-th PMOS transistor and $PW_i$ is the width of i-th PMOS transistor. The overall failure probability of a gate will then be the summation of Eqns. (5) and (6).

Figure 7B:
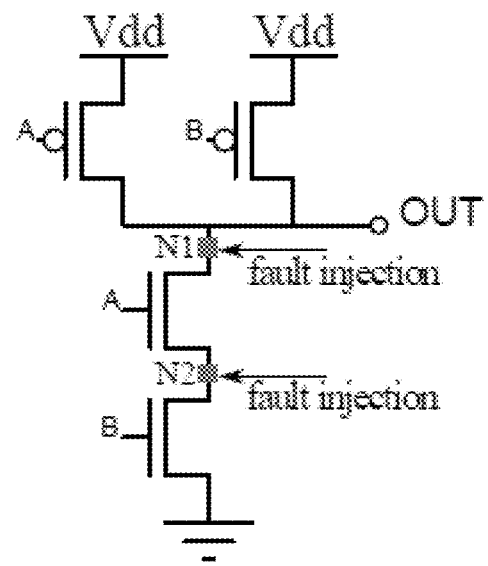
FIG. 7B depicts an exemplary 2-input NAND gate illustrating a stuck-at-0 fault and FIG. 7C depicts an exemplary 2 input NAND gate illustrating a stuck-at-1 fault.
Figure 7C:
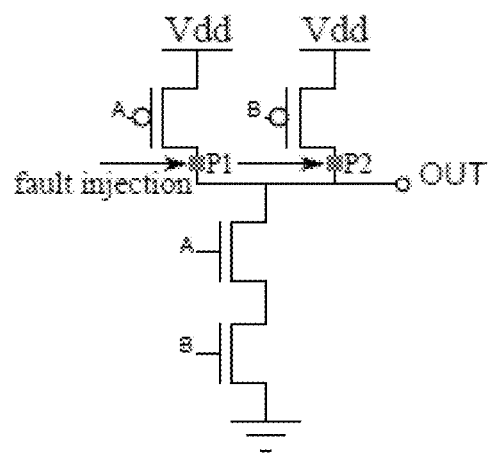

In what follows, is described with reference to FIGS. 7B and 7C a framework for computing the probability of fault injections in a gate and computing the probability of failure of the gate. FIG. 7B depicts a 2 input NAND gate illustrating a stuck-at-0 fault and FIG. 7C depicts a 2 input NAND gate illustrating a stuck-at-1 fault.

For sake of completeness, a thorough case study for the 45 nm process technology is described to elaborate the reliability evaluation scheme. The basic process related parameters used in this study employ minimum feature size and are shown in Table II. It must be noted that in practical designs the minimum widths of the transistors are adjusted to cater for the specifications of desired application.

TABLE II

Parameters considered in the evaluation.

| | |
|---|---|
| Technology (T) | 45 nm = 0.045μ |
| nMOS width (NW$_i$) | 2 × T = 0.09μ |
| pMOS width (PW$_i$) | 4 × T = 0.18μ |
| Charge (Q) | 0.04 pC |

For NAND gates, the sa0 fault propagation probability is computed for input patterns where the output is logic "1". For example, for a 2-input NAND gate, there are a maximum of four input combinations i.e. {00, 01, 10, 11}. The sa0 propagation probability of the i-th NMOS transistor is computed out of the input combinations producing logic "1" as an output i.e., {00, 01, 10}.

FIG. 7B depicts the CMOS structure of a 2-input NAND gate. A transient with charge (Q) of 0.04 pC injected at drain "N1" will always be propagated to the output of gate for input patterns {00, 01, 10}. Therefore, the probability of fault propagation, computed using Eqn. 4, for NMOS transistor connected to input "A" to the output "OUT" in FIG. 7B is $$\left(\frac{0.75}{0.75}\right).$$

Thus, the sa0 injection probability at the gate level is "1". Accordingly, when a sa0 fault is injected at the output of the 2-input NAND gate, it will fail with the probability of $$\left(\frac{3}{4}\right),$$

because for 3 of the 4 possible vectors the gate will fail.

Further, the transient hit at "N2" should only be propagated to the output if and only if the value of input "A" is logic "1" i.e., for input pattern 10, implying fault propagation probability of $$\left(\frac{0.25}{0.75}\right).$$

Since, the fault propagation to the output of a gate is highly dependent on the transient charge value, thus, not necessarily true that the fault injected at "N2" will not be propagated for the input patterns {00, 01}. To overcome the uncertainty regarding the fault propagation under all possible input combinations, by one embodiment, SPICE level circuit simulations are performed. Based on SPICE simulations, the transient fault injected at drain "N2" with charge (Q) value of 0.04 pC can be observed at the output for input patterns {00, 10}. Therefore, fault propagation probability for NMOS transistor connected to input "B" is $$\left(\frac{0.5}{0.75}\right).$$

FIG. 7C illustrates the sa1 scenario when a fault hits any of the PMOS transistor P1 or P2 of 2-input NAND gate. In this case, the fault will be observed at the output for the input pattern {11} only. Thus, the sa1 fault propagation of 2-input NAND gate is $$\left(\frac{0.25}{0.25}\right) = 1$$

and the failure probability of gate is $$\left(\frac{0.25}{1}\right) = 0.25,$$

because for 1 out 4 possible input combinations the gate will fail. Further, applying Eqns. (2) and (3) with $\lambda=1$, the sa0 and sa1 injection probabilities of a 2-input NAND gate; can be computed as follows:

$$sa0\ inj.\ Prob. = \sum_{i=1}^{2} Propagation_{Ni} \times \frac{\lambda NW_i}{\sum_{i=1}^{2} \lambda NW_i}$$

$$= \frac{\frac{0.25}{0.75} \times 0.09 + \frac{0.25}{0.75} \times 0.09}{\sum_{i=1}^{2} 0.09}$$

$$= 0.333$$

In a similar manner, the sa1 injection probability can be computed as:

$$sa0\ inj.\ Prob. = \sum_{i=1}^{2} Propagation_{Pi} \times \frac{PW_i}{\sum_{i=1}^{2} \lambda PW_i}$$

$$= \frac{1 \times 0.18 + 1 \times 0.18}{\sum_{i=1}^{2} 0.18}$$

$$= 1$$

Thus, the injection probabilities of NAND21 (FIG. 4A) can be computed as follows: in NAND21, the protection against the transient fault at the drain of NMOS transistor N1 is provided by duplicating the PMOS transistor P1 and scaling the widths of duplicated P1_1 and P1_2 transistors by the factor $\lambda$. The value of $\lambda$ is increased incrementally until the output voltage V>VDD/2, and is derived empirically using SPICE. By one embodiment, for the NAND21 gate, the value of $\lambda$ is found to be 2.5. Therefore, the fault injection probabilities can be expressed as:

$$sa0\ inj.\ Prob. = \sum_{i=1}^{2} Propagation_{Ni} \times \frac{\lambda NW_i}{\sum_{i=1}^{2} \lambda NW_i}$$

$$= \frac{\frac{0.25}{0.75} \times 0.09 + \frac{0.25}{0.75} \times 0.09}{\sum_{i=1}^{2} 0.09}$$

$$= 0.333$$

Note that $\lambda=1$ is used for NMOS transistors as they are not scaled. The area of P1_1 and P1_2 PMOS transistors is $\lambda \times PW$. The sa1 fault injection probability, then, can be computed as follows:

$$sa1\ inj.\ Prob. = \sum_{i=1}^{2} Propagation_{Pi} \times \frac{\lambda PW_i}{\sum_{i=1}^{3} \lambda PW_i}$$

$$= \frac{2 \times \lambda \times 0.18 + 1 \times 0.18}{\left(\sum_{i=1}^{2} \lambda \times 0.18\right) + 0.18}$$

$$= 1$$

It must be appreciated that in NAND21 the sa0 injection probability reduced from 0.833 to 0.33 due to protecting the fault that occurs at the drain of N1 transistor. The only unprotected case that allows fault to appear at the output is the input pattern {10}.

As stated above, in case of 2-input NAND gate, the sa0 fault propagation probability of two NMOS transistors is $$\left(\frac{0.75}{0.75}\right) \text{ and } \left(\frac{0.5}{0.75}\right),$$

respectively. Accordingly, the failure probability $Failure_i$ of the corresponding NMOS transistors will be $$\left(\frac{0.75}{1}\right) \text{ and } \left(\frac{0.5}{1}\right).$$

The theoretical failure probability of a 2-input NAND gate with $\lambda=1$ can be computed using Eqns. (5) and (6) as follows:

$$\text{Failure } Prob. = Prob. \, sa0 \text{ fault} + Prob. \, sa1 \text{ fault}$$

$$= \sum_{i=1}^{2} Failure_{N1} \times \frac{\lambda NW_1}{\text{Area}} + \sum_{i=1}^{2} Failure_{P1} \times \frac{\lambda NW_1}{\text{Area}}$$

$$= \left(\frac{\overbrace{\frac{0.75}{1} \times 0.09 + \frac{0.5}{1} \times 0.09}^{N1,N2}}{0.54}\right) + \overbrace{\left(2 \times \frac{0.25}{1} \times \frac{0.18}{0.54}\right)}^{P1,P2}$$

$$= 0.208 + 0.167$$

$$= 0.375$$

In a similar fashion, the failure probability of NAND21 with $\lambda=2.5$ will be reduced to 0.25 as can be seen in the following calculations:

$$\text{Failure } Prob. = \sum_{i=1}^{2} Failure_{Ni} \times \frac{\lambda NW_i}{\text{Area}} + \sum_{i=1}^{3} Failure_{Pi} \times \frac{\lambda PW_i}{\text{Area}}$$

$$= \left(\frac{\overbrace{\frac{0.25}{1} \times 0.09 + \frac{0.25}{1} \times 0.09}^{N1,N2}}{1.26}\right) + \overbrace{\left(2 \times \frac{0.25}{1} \times \frac{0.18}{0.26}\right)}^{P1\_1,P2\_2} + \overbrace{\left(\frac{0.25}{1} \times \frac{0.18}{0.26}\right)}^{P2}$$

$$= 0.250$$

Figure 8:
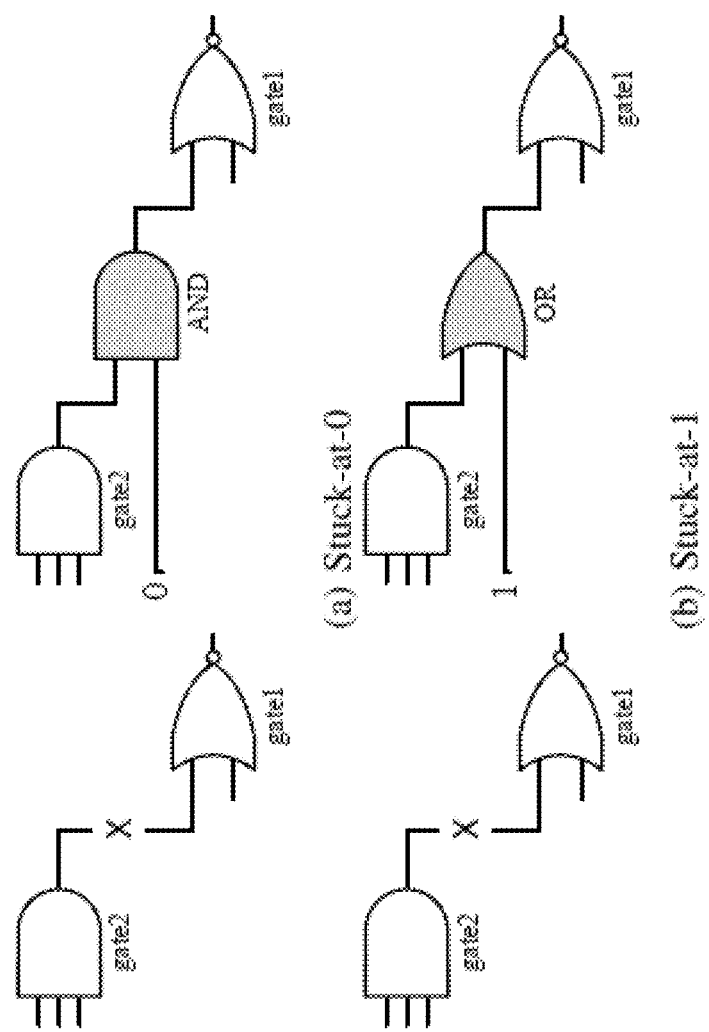
FIG. 8 illustrates exemplary scenarios depicting fault injection mechanisms performed at the gate level.

Turning now to FIG. 8 is illustrated exemplary scenarios depicting fault injection mechanisms performed at the gate level. According to one embodiment of the present disclosure, two fault injection mechanisms can be applied. The first method performs fault injection at the circuit level measures the magnitude of voltage $V_{out}$ at the output. The second method deals with injecting the fault at logic level by flipping the output of a gate. To compute empirical reliability of a circuit, both fault injections mechanisms can be used separately.

In the first method referred to herein as a circuit-level fault injection method, the current I of charge Q is injected at the drain of a transistor. The direction of injected current is from drain-to-body in the NMOS transistor and from body-to-drain in the PMOS transistor. The magnitude and pulse width of injected current can be modeled using Eqn. (1). The flowchart depicted in FIG. 9 illustrates the steps of failure rate/reliability computation at SPICE level.

Figure 10:
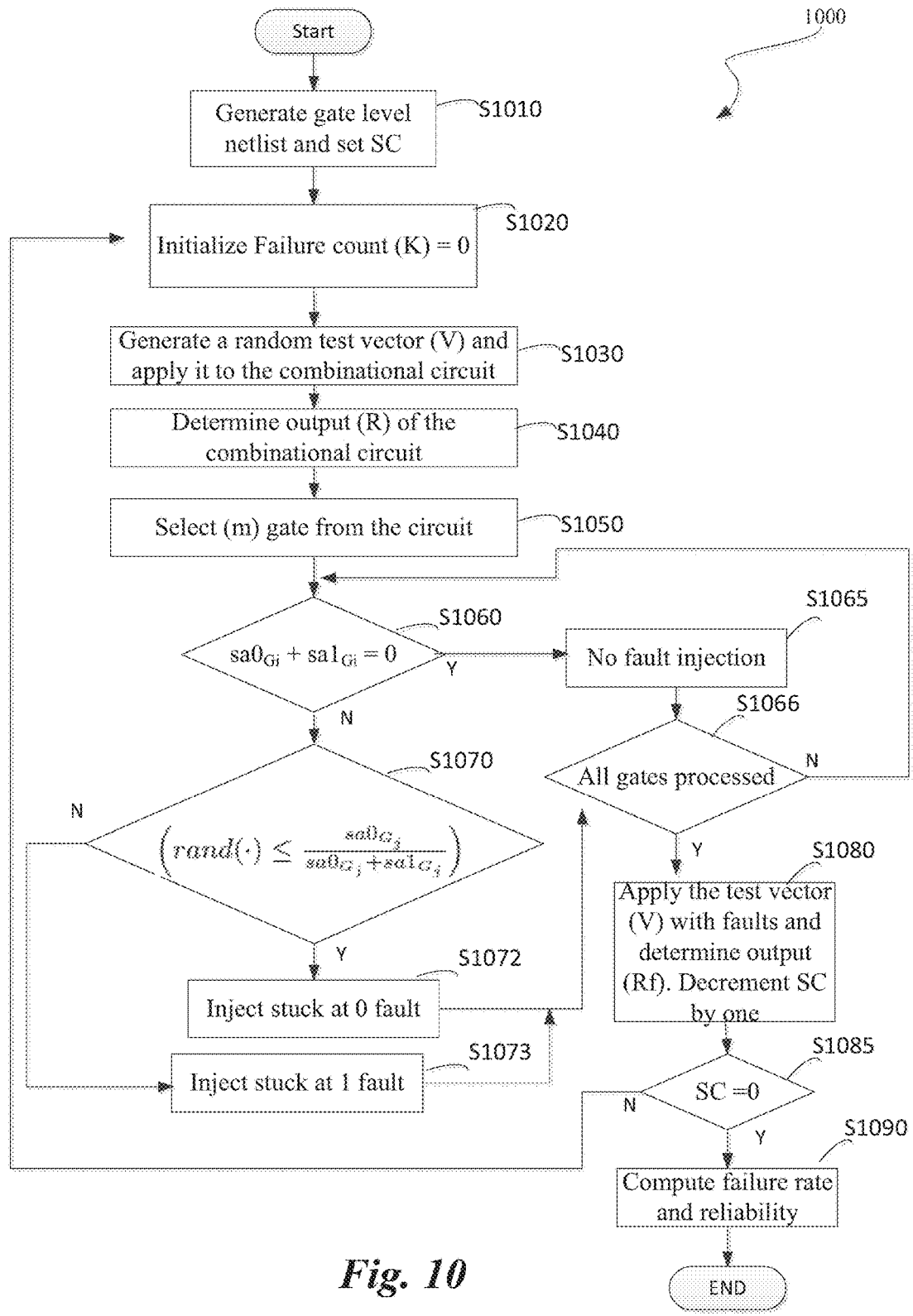
FIG. 10 illustrates a flowchart depicting the steps performed to compute the failure rate at a gate level.
Figure 11A:
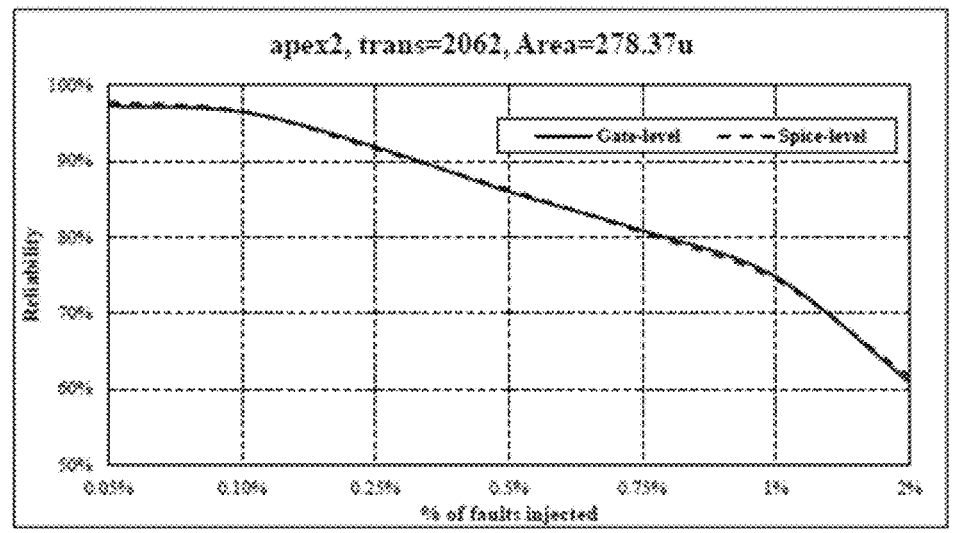
FIGS. 11A-11D demonstrate exemplary simulation results depicting a close match between SPICE and gate-level simulations.
Figure 11B:
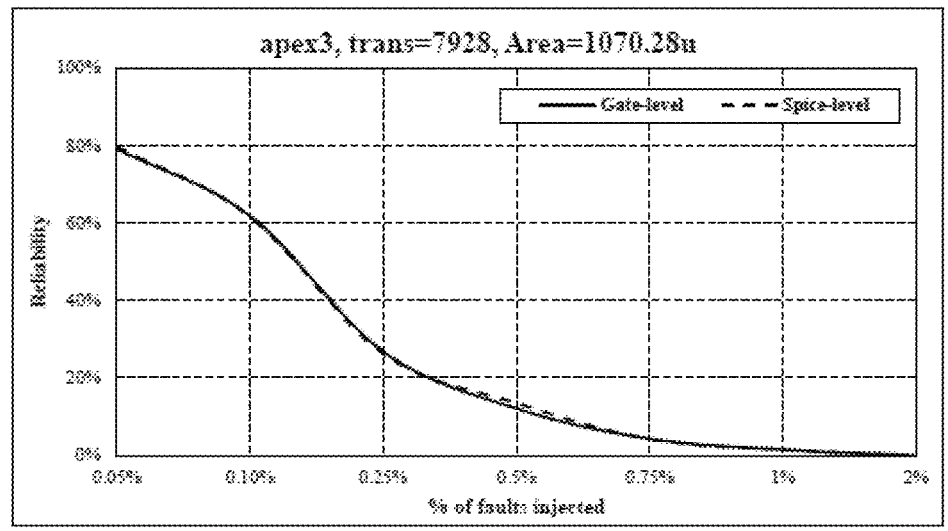
Figure 11C:
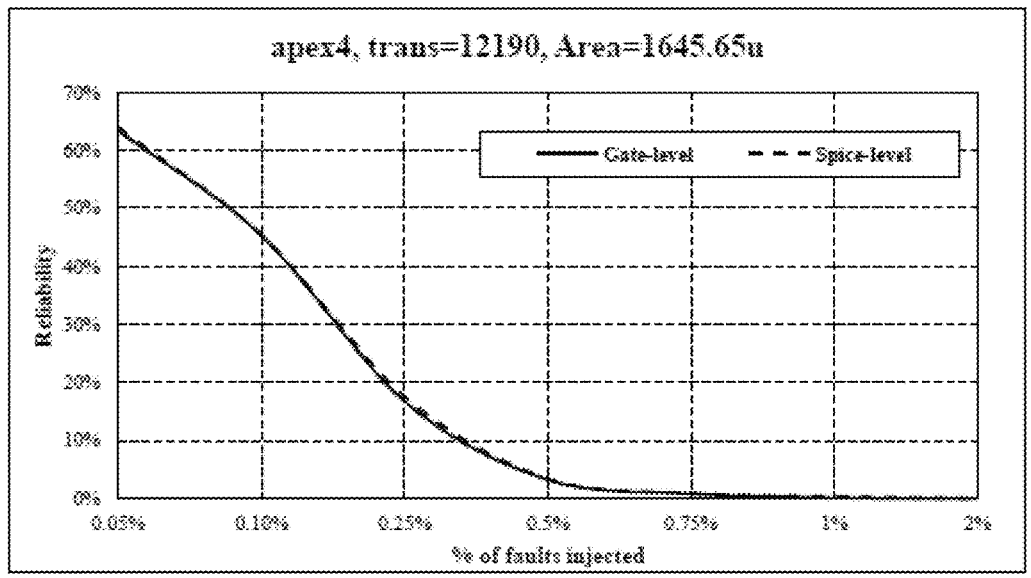
Figure 11D:
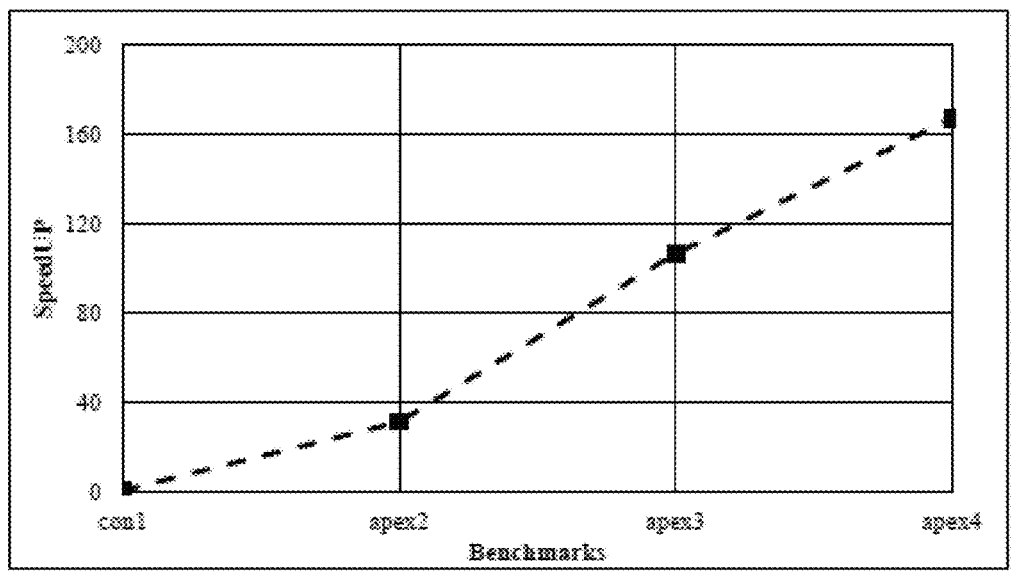

In the second method referred to herein as a gate-level fault injection method, the faults injected at the gate level assume a stuck at fault model. Specifically, when faults are injected at any line, it can be either stuck-at-1 (i.e., connected to Vdd) or stuck-at-0 (i.e., connected to ground). The flowchart depicted in FIG. 10 is used to compute the circuit failure rate/reliability at the gate level.

Figure 9:
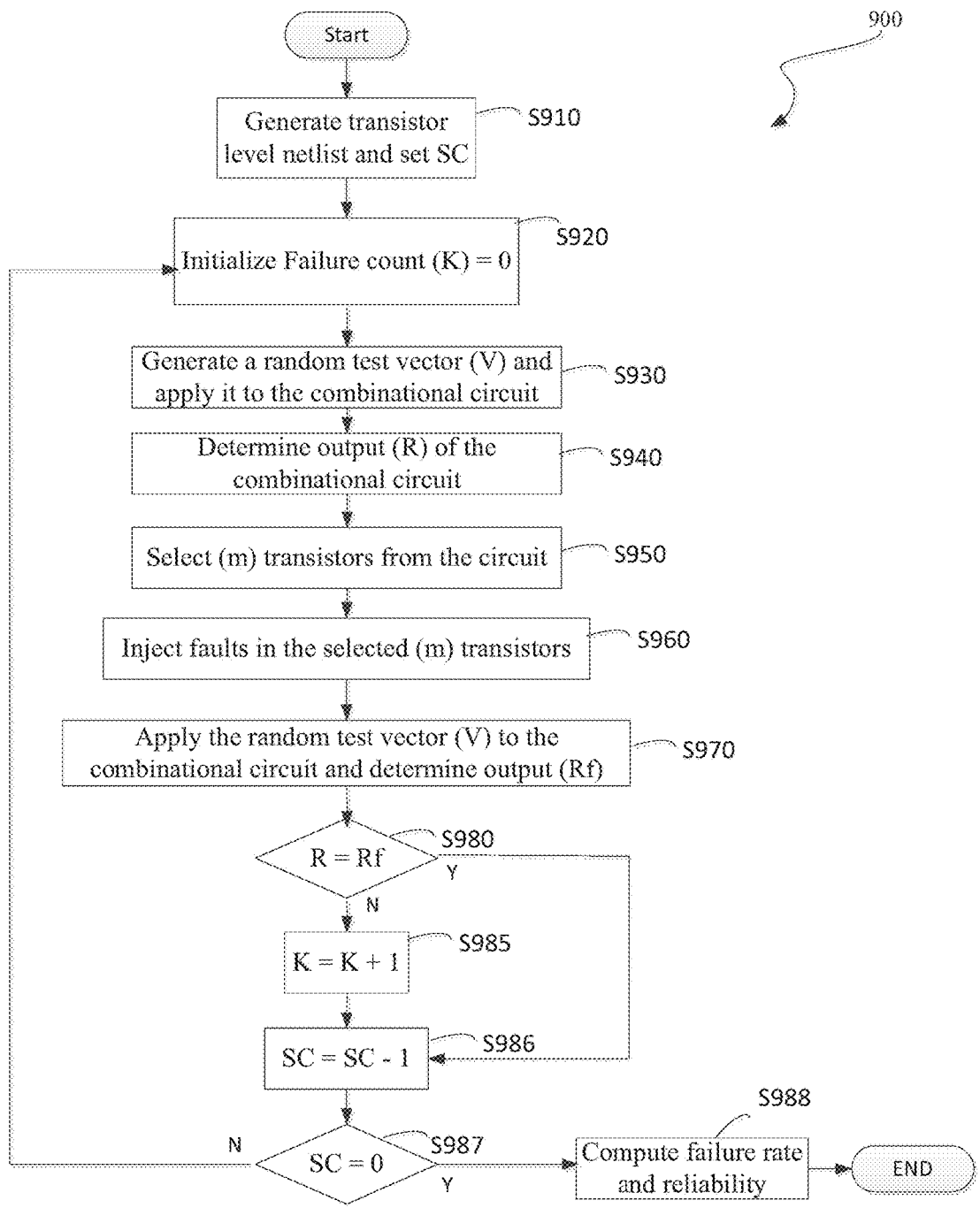
FIG. 9 illustrates a flowchart depicting the steps performed to compute reliability at a circuit level.

FIG. 9 illustrates a flowchart 900 depicting the steps performed to compute reliability at a circuit level. The process commences in step S910 wherein a transistor level netlist is generated and a simulation count (SC) parameter is initialized. The parameter SC corresponds to the number of times the simulation is performed in order to compute the failure rate (and thus the reliability of the system).

The process then moves to step S920, wherein a failure count parameter (K) is initialized to zero. Note that the parameter K is initialized to zero for each simulation run.

In step S930, a random test vector (V) is generated and applied to the combinational circuit. In step S940, the output (R) of the combinational circuit for the input (V) is determined and saved.

The process further proceeds to step S950, wherein m transistors are selected by implementing a Roulette wheel algorithm. Further, in step S960, faults are injected in the selected m transistors of step S950.

In step S970, the random test vector (V) including the injected faults is applied to the combinational circuit and thereafter the output (Rf) corresponding to the input with injected faults is determined and saved.

The process then proceeds to step S980 wherein a query is made to determine whether the outputs R and Rf are equal. If the response to the query is negative, the process proceeds to step S985, whereas if the response to the query of step S980 is affirmative, the process moves to step S986.

In step S985, the value of the failure count parameter (K) is incremented by one, whereafter the process moves to step S986.

In step S986, the value of the simulation count parameter (SC) is decremented by one and the process moves to step S987. In step S987, a query is made to determine whether the simulation count parameter is zero (indicating that all simulation runs have been performed). If the response to the query is negative, the process loops back to step S920 and repeats the process in steps S920-S987 for the next simulation run. However, if the response to the query in step S987 is affirmative, the process moves to step S988.

In step S988, the failure rate (Fm) and reliability (% Rel) of the combinational circuit are computed. Specifically, the failure rate is computed as Fm=(K/SC) amd reliability is computed as % Rel=(1−Fm)*100. Upon computing the failure rate and the reliability of the combinational circuit, the process of FIG. 9 terminates.

Turning now to FIG. 10 is illustrated a flowchart 1000 depicting the steps performed to compute the fialure rate and reliability at the gate level of the combination circuit.

The process commences in step S1010 wherein a gate level netlist is generated and a simulation count (SC) parameter is initialized. The parameter SC corresponds to the number of times the simulation is performed in order to compute the failure rate (and thus the reliability of the system).

The process then moves to step S1020, wherein a failure count parameter (K) is initialized to zero. Note that the parameter K is initialized to zero for each simulation run.

In step S1030, a random test vector (V) is generated and applied to the combinational circuit. Further, the output (R) of the combinational circuit for the input (V) is determined and saved in step S1040.

In step S1050, m gates are selected by implementing a Roulette wheel (RW) algorithm. Note that due to the nature of the RW algorithm, gates with a higher area have a higher probability of selection.

The process then proceeds to step S1060 wherein, for each of the selected m gates, a query is made to determine whether $sa0_{Gi} + sa1_{Gi} = 0$. Note that the parameter $sa0_{Gi}$ corresponds to stuck-at-0 injection probability of gate i, and the parameter $sa1_{Gi}$ corresponds to stuck-at-1 injection probability of gate i. If the response to response to the query in step S1060 is affirmative the process moves to step S1065, whereas if the response to the query is negative, the process moves to step S1070.

In step S1065 no faults are injected in the circuit as sa0 and sa1 are protected and the process thereafter proceeds to step S1066.

In step S1070, a query is made to determine whether rand(.) is less than $(sa0_{Gi}/(sa0_{Gi}+sa1_{Gi}))$, wherein rand(.) is a random number selected from the range $(0, sa0_{Gi}+sa1_{Gi})$. If the response to the query in step S1070 is affirmative the process proceeds to step S1072 wherein a stuck-at-0 fault is injected in the gate under consideration. The process thereafter moves to step S1066.

However, if the response to the query in step S1070 is negative, the process in step S1073 injects a stuck-at-1 fault in to the gate under consideration. Thereafter the process moves to step S1066.

In step S1066 a query is made to determine whether all the selected m gates (of step S1050) are processed. If the response to the query is negative, the process loops back to step S1060 to repeat the process for the next gate. However, if all of the selected m gates are processed, the process moves to step S1080 wherein, the test vector V including injected faults is applied to the circuit and the output of the circuit (Rf) is determined. If the value of output of the circuit for the two cases (with and without injected faults) i.e., R and Rf are not equal then the value of the parameter failure count K is incremented by 1. Additionally, in step S1080 the value of the simulation count parameter is decremented by one.

The process then moves to step S1085, wherein a query is made to determine whether the simulation count parameter is zero (indicating that all simulation runs have been performed). If the response to the query is negative, the process loops back to step S1020 and repeats the process for the next simulation run. However, if the response to the query in step S987 is affirmative, the process moves to step S1090.

In step S1090, the failure rate (Fm) and reliability (% Rel) of the combinational circuit are computed. Specifically, the failure rate is computed as Fm=(K/SC) amd reliability is computed as % Rel=(1−Fm)*100. Upon computing the failure rate and the reliability of the combinational circuit, the process of FIG. 10 terminates.

According to one embodiment, a comparison between SPICE and Gate level simulations is depicted in FIGS. 11A-11D for few benchmark circuits. FIGS. 11A-11D demonstrate the close match between SPICE and gate-level simulations. By one example, the circuits are evaluated after performing 1000 iterations for each fault injected case. For instance, in FIG. 11C, 0.10% on the x-axis corresponds to 0.1%×12190≈12 faults injected in the circuit and it achieved reliability of 60% after performing 1000 iterations for both SPICE and gate level simulations.

Furthermore, by one embodiment, time is another factor that is taken into account while evaluating a circuit for reliability. The time taken by SPICE simulations becomes exorbitantly high as the number of transistors are increased. For example, the apex4 benchmark circuit takes around 4 days for SPICE simulations, while the gate-level simulations take 30 minutes for completion, thereby achieving speedup of ≈167x. Further, it can be observed from FIG. 11D that as the number of transistors are increased, the time gain achieved by gate level simulations also increases.

According to one embodiment, investigation is made to find the impact of the proposed protection techniques described herein on the area and reliability of a circuit. LGSynth'91 benchmark, which includes circuits with varying complexity in terms of area, number of inputs and outputs are used for the evaluation of described techniques. Critical nodes in a circuit are identified based on the fault simulation of one million random test vectors using the parallel fault simulator Hope.

Since a single protection threshold is not sufficient to achieve desired reliability for all benchmark circuits, because one circuit may achieve better reliability at a lower threshold while some other circuit may require higher protection threshold to achieve acceptable reliability. Therefore, the simulations are performed for varying protection thresholds to find the best compromise between area and reliability for each circuit. The number of faults injected in a protected circuit are prorated according to their area overhead. The proposed techniques are also compared to the Triple Modular Redundancy (TMR) method and Double Modular Redundancy (DMR) schemes. Table III highlights the reliability of original circuits without protection against 1, 2 and 5 faults. The Area of a benchmark is computed by summing the drain area of all the NMOS and PMOS transistors.

The LGSynth'91 benchmark circuits used herein is represented in two-level pla-formats, therefore, they are minimized using Espresso tool (as described by R. K. Brayton, A. L. Sangiovanni-Vincentelli, C. T. McMullen, and G. D. Hachtel, in *Logic Minimization Algorithms for VLSI Synthesis*. Norwell, Mass., USA: Kluwer Academic Publishers, 1984 and incorporated herein in its entirety) and then synthesized using SIS (as described by E. Sentovich, K. Singh, L. Lavagno, C. Moon, R. Murgai, A. Saldanha, H. Savoj, P. Stephan, R. K. Brayton, and A. L. Sangiovanni-Vincentelli, in "Sis: Online: A system for sequential circuit synthesis," EECS Department, University of California, Berkeley, Tech. Rep. UCB/ERL M92/41, 1992, and incorporated herein in its entirety) to get the proper gate-level representation of the circuit.

The library used for synthesis includes an inverter and 2-, 3- and 4-input NAND and NOR gates. The parameter phase in the logic minimization process defines whether the ON-set (phase=1) or OFF-set (phase=0) of the corresponding output function should be used and minimized. By default, ON-set of each output is minimized by the Espresso tool. However, a very interesting observation is made that if an output function is synthesized based on the majority output i.e., phase=1-if most of the time output is 1 for an output or phase=0-if most of the time output is 0 for an output, then, good area savings are achieved along with better reliability against single fault.

reduction in average area overhead by 32%, 0.61% and 75% for 95%, 98% and 99% protection thresholds, respectively, while keeping the average reliability very close to the average solutions of Table IV(a).

TABLE III

Reliability of Original Circuits

| | True Phase Synthesis | | | Majority Phase Synthesis | | | | |
|---|---|---|---|---|---|---|---|---|
| Circuit | Area1 (μm)[1] | 1 Fault | 2 Faults | 5 Faults | Area2 (μm) | 1 Fault | 2 Faults | 5 Faults | ΔArea[2] |
| alu4 | 633.95 | 96.75% | 93.60% | 84.40% | 511.65 | 95.81% | 92.60% | 82.75% | −19.29% |
| apex1 | 1482.29 | 95.13% | 91.15% | 75.45% | 1558.98 | 96.55% | 93.00% | 82.45% | 5.17% |
| apex2 | 278.37 | 98.57% | 97.35% | 93.65% | 187.65 | 98.83% | 97.05% | 94.05% | −32.59% |
| apex3 | 1070.27 | 94.18% | 88.25% | 73.65% | 1033.83 | 95.87% | 92.30% | 81.30% | −3.40% |
| apex4 | 1645.65 | 93.83% | 88.85% | 73.40% | 1578.96 | 95.28% | 89.65% | 77.90% | −4.05% |
| b12 | 45.09 | 84.07% | 72.85% | 44.55% | 38.88 | 83.18% | 69.75% | 44.65% | −13.77% |
| clip | 129.06 | 92.76% | 85.05% | 70.50% | 127.71 | 92.23% | 85.60% | 68.25% | −1.05% |
| cordic | 82.62 | 97.59% | 95.45% | 89.85% | 83.16 | 97.87% | 96.60% | 91.25% | 0.65% |
| ex5 | 328.32 | 88.13% | 78.15% | 55.00% | 329.94 | 92.47% | 84.25% | 67.25% | 0.49% |
| misex1 | 48.33 | 80.25% | 64.00% | 32.95% | 50.49 | 85.05% | 74.60% | 49.30% | 4.47% |
| misex2 | 78.03 | 83.90% | 69.55% | 41.60% | 75.06 | 92.28% | 84.65% | 66.70% | −3.81% |
| misex3 | 834.57 | 96.87% | 94.65% | 85.65% | 649.62 | 97.31% | 94.15% | 88.10% | −22.16% |
| rdS4 | 127.71 | 89.98% | 81.90% | 63.05% | 171.18 | 92.10% | 84.60% | 66.95% | 34.04% |
| seg | 1624.59 | 98.04% | 96.55% | 91.15% | 1712.07 | 99.25% | 97.60% | 96.25% | 5.38% |
| squar5 | 38.61 | 79.93% | 66.60% | 37.15% | 32.94 | 81.48% | 67.45% | 40.50% | −14.69% |
| table3 | 1063.8 | 96.34% | 91.40% | 81.35% | 1161.27 | 98.16% | 96.55% | 90.90% | 9.16% |
| table5 | 1118.34 | 96.63% | 93.80% | 82.70% | 1190.16 | 98.19% | 96.10% | 91.10% | 6.42% |
| z5xp1 | 86.13 | 85.36% | 72.25% | 45.65% | 86.13 | 85.24% | 75.20% | 48.80% | 0% |
| Avg. | | 91.57% | 84.52% | 67.87% | | 93.18% | 87.32% | 73.80% | −2.72% |

[1]Summation of nmos and pmos drain widths

[2]$\Delta Area = \left(\frac{Area2 - Area1}{Area1}\right) \times 100$

Table III highlights the increase in reliability and the area savings achieved, under the ΔArea column header, when the circuits are synthesized w.r.t the majority phase. The negative sign in the Area Savings column denote the reduction in area by 2.72% as compared to the area of circuits minimized by Espresso tool using default parameters. So, circuits minimized with the majority phase are the baseline circuits used in all our simulations in this work. It can be observed that for few benchmarks reliability is above 90% for all fault injection scenarios. It is observed that these benchmarks promise great reliability improvement with slight area overhead.

Table IV (a) shows the reliability achieved by techniques described herein when single fault is injected. Table IV (a) is an application of STR technique and highlights the reliability of circuits for varying protection thresholds. A protection threshold of 98% implies protecting all gates having fault detection probability greater than or equal to 1−98%=0.02. It must be noted that the applied protection threshold highly correlates with the reliability achieved by the circuit for a single fault. The results of STR with area overhead constraint are shown in Table IV for a single fault.

The area constraint technique is applied by successively decreasing the area overhead of a circuit until the area overhead becomes zero or the reliability goes below the desired threshold. For example, in Table IV(a), circuit table3 achieves 99.6% reliability with an area overhead of 1.17 by applying 99% protection threshold. Whereas, reliability of table3 in Table IV(b) under the 99% column implies the fact that the minimum area overhead required to achieve reliability greater than or equal to 99% is at least 0.25. From Table IV(b), it is also evident that the average solutions achieved by minimum area overhead algorithm shows the For alu4, apex1, apex2, apex3, apex4, cordic, misex3, seq, table3 and table5 benchmarks in Table IV (b) under 95% column, zero area overhead implies that these benchmarks achieve 95% reliability against a single fault without area overhead. To find the minimum area overhead required for each protection threshold, STR and STR with area overhead technique work in tandem to search for this point.

The simulations are further extended based on the single fault analysis results. Based on the area overhead, each circuit is analyzed against multiple faults. The number of faults is correlated to the area of a circuit. Table V and Table VI shows the reliability achieved by prorating the 1, 2 and 5 faults for each circuit according to its area. If the area overhead is (131%), then the actual area is increased from 100% to 231% or from 1 to 2.31 in terms of fraction. So, 1, 2 and 5 faults in the original circuit will prorate to 2.31, 4.62 and 11.55 faults in the protected circuit. For each prorated fault, the circuit is simulated twice.

TABLE IV

Reliability of Proposed Methods with Single Fault

| | 95% | | 98% | | 99% | |
|---|---|---|---|---|---|---|
| Circuit | OH | Rel | OH | Rel | OH | Rel |
| (a) Varying protection threshold | | | | | | |
| alu4 | 72.01% | 96.70% | 138.81% | 98.60% | 220.08% | 99.25% |
| apex1 | 64.50% | 96.60% | 114.40% | 98.50% | 175.40% | 99.05% |
| apex2 | 17.40% | 99.55% | 38.19% | 99.45% | 71.43% | 99.60% |
| apex3 | 68.77% | 98.20% | 133.94% | 99.20% | 217.17% | 99.30% |
| apex4 | 116.61% | 97.65% | 232.38% | 98.95% | 317.13% | 99.25% |
| b12 | 217.93% | 95.35% | 322.22% | 98.00% | 421.85% | 99.30% |
| clip | 157.73% | 96.85% | 244.03% | 98.70% | 319.99% | 99.20% |
| cordic | 25.71% | 98.20% | 69.89% | 98.90% | 96.65% | 99.40% |

TABLE IV-continued

Reliability of Proposed Methods with Single Fault

| | 95% | | 98% | | 99% | |
|---|---|---|---|---|---|---|
| Circuit | OH | Rel | OH | Rel | OH | Rel |
| ex5 | 130.76% | 96.40% | 242.55% | 98.45% | 325.88% | 99.10% |
| misex1 | 293.44% | 95.05% | 411.84% | 98.40% | 489.06% | 99.30% |
| misex2 | 125.25% | 98.05% | 167.72% | 98.50% | 207.87% | 99.45% |
| misex3 | 50.13% | 97.75% | 124.27% | 99.00% | 197.56% | 99.20% |
| rd84 | 149.37% | 97.90% | 240.34% | 98.80% | 338.08% | 99.60% |
| seq | 11.31% | 99.60% | 15.62% | 99.70% | 29.54% | 99.60% |
| squar5 | 341.32% | 95.90% | 432.68% | 98.40% | 498.96% | 99.75% |
| table3 | 16.44% | 98.65% | 41.17% | 98.80% | 73.91% | 99.65% |
| table5 | 20.70% | 98.55% | 54.16% | 99.25% | 92.58% | 99.65% |
| z5xp1 | 262.45% | 99.55% | 390.99% | 99.33% | 444.08% | 99.65% |
| Avg. | 118.99% | 97.58% | 189.73% | 98.83% | 252.07% | 99.41% |
| (b) Minimum area overhead | | | | | | |
| alu4 | 0% | 95.81% | 86% | 98.20% | 148% | 99.20% |
| apex1 | 0% | 96.55% | 70% | 98.10% | 158% | 99.10% |
| apex2 | 0% | 98.83% | 0% | 98.83% | 4% | 99.10% |
| apex3 | 0% | 95.87% | 46% | 98.20% | 124% | 99.02% |
| apex4 | 0% | 95.28% | 82% | 98.11% | 166% | 99.10% |
| b12 | 228% | 95.10% | 274% | 98.10% | 328% | 99.03% |
| clip | 120% | 95.10% | 190% | 98.10% | 256% | 99.20% |
| cordic | 0% | 97.87% | 4% | 98.02% | 68% | 99.10% |
| ex5 | 146% | 95.20% | 196% | 98.20% | 270% | 99.20% |
| misex1 | 312% | 95.10% | 388% | 98.10% | 422% | 99.02% |
| misex2 | 58% | 95.01% | 94% | 98.10% | 144% | 99.04% |
| misex3 | 0% | 97.31% | 10% | 98.20% | 92% | 99.10% |
| rd84 | 120% | 95.10% | 166% | 98.20% | 178% | 99.10% |
| seq | 0% | 99.25% | 0% | 99.25% | 0% | 99.25% |
| squar5 | 322% | 95.03% | 384% | 98.05% | 438% | 99.04% |
| table3 | 0% | 98.16% | 0% | 98.16% | 10% | 99.10% |
| table5 | 0% | 98.19% | 0% | 98.19% | 3% | 99.10% |
| z5xp1 | 258% | 95.03% | 334% | 98.10% | 380% | 99.12% |
| Avg. | 86.89% | 96.32% | 129.11% | 98.23% | 177.17% | 99.11% |

For example, if the prorated faults to be injected are 4.65, then the circuit is simulated twice, first by injecting 4 faults and then by injecting 5 faults. The failure rate achieved by both fault injection scenarios is then averaged to compute the final failure rate/reliability. It is interesting to observe that even with prorated faults the average solutions achieved by minimum area overhead in Table VI are very close to the ones in Table V for 1 and 2 prorated faults scenario. For 5 prorated faults, the reliability for 95% threshold drops due to the fact that majority of the benchmarks are not protected because their reliability against single faults is above 95%.

For comparison with other redundancy techniques, Table VII shows the reliability achieved by TMR and DMR algorithms. Both TMR and DMR are evaluated under the conditions same as for STR and STR area overhead techniques. The average area incurred by TMR and DMR is always more than three times and two times the original area. Comparing to the TMR, it can be observed that the average reliability achieved by proposed schemes under all fault injection scenarios are far better. The only exception is for the single fault scenario, where TMR achieves 94.33% reliability under 95% column header, whereas, the selective-redundancy and minimum area overhead algorithms, still very close the TMR, achieve 93.74% and 93.86% reliability, respectively. The TMR majority voter is then protected by applying the STR technique. The results for TMR with protected voter are shown in Table VII (b) and it can be observed that the average results are improved by 4%, 2.6% and 4% for different fault injection scenarios as compared to the TMR with non-protected voter, but with an additional area overhead of 24%. Again, the proposed algorithms achieve better reliability measures as compared to the TMR with protected voter, with the exception of single fault case.

The DMR algorithm is implemented using the C-Element as a voter. The C-Element is an asynchronous latch with two inputs, it only changes the output value if both the input values are the same, otherwise, it keeps the previous value. The DMR incurs less overhead as compared to the TMR, but achieves better average reliability than it, nonetheless, not better than the proposed methods. Table VII (c) highlights the results obtained with DMR. It is evident that the proposed algorithms, even with the minimum area overhead achieve better reliability as compared to the DMR. Fully protecting the C-Element does increase the reliability, but, at an average area overhead cost of 560.10%, evident from Table VII (d).

TABLE V

Reliability of Varying Protection Threshold Method with Prorated Faults

| Circuit | 95% | 98% | 99% |
|---|---|---|---|
| (a) 1 Prorated Fault | | | |
| alu4 | 95.80% | 96.72% | 98.33% |
| apex1 | 95.04% | 96.40% | 96.59% |
| apex2 | 99.24% | 99.29% | 99.17% |
| apex3 | 96.65% | 97.89% | 97.04% |
| apex4 | 94.39% | 96.45% | 97.50% |
| b12 | 86.29% | 94.39% | 96.57% |
| clip | 93.42% | 95.58% | 97.22% |
| cordic | 97.24% | 97.16% | 98.92% |
| ex5 | 91.03% | 93.69% | 96.18% |
| misex1 | 84.30% | 92.02% | 96.95% |
| misex2 | 96.06% | 96.33% | 98.00% |
| misex3 | 97.17% | 97.20% | 97.58% |
| rd84 | 94.14% | 96.46% | 96.67% |
| seq | 99.58% | 99.57% | 99.71% |
| squar5 | 84.96% | 91.64% | 97.36% |
| table3 | 98.66% | 98.70% | 99.00% |
| table5 | 98.36% | 98.66% | 98.71% |
| z5xp1 | 85.03% | 95.15% | 97.57% |
| Avg. | 93.74% | 96.29% | 97.73% |
| (b) 2 Prorated Faults | | | |
| alu4 | 93.41% | 94.14% | 96.30% |
| apex1 | 94.69% | 94.94% | 95.03% |
| apex2 | 98.26% | 98.70% | 99.01% |
| apex3 | 94.29% | 94.28% | 95.38% |
| apex4 | 92.27% | 94.12% | 95.05% |
| b12 | 85.30% | 92.90% | 94.33% |
| clip | 91.64% | 93.58% | 96.17% |
| cordic | 96.58% | 96.69% | 98.05% |
| ex5 | 88.79% | 91.98% | 95.50% |
| misex1 | 79.83% | 89.33% | 93.60% |
| misex2 | 93.15% | 95.62% | 97.47% |
| misex3 | 95.45% | 96.46% | 97.01% |
| rd84 | 92.10% | 94.81% | 95.56% |
| seq | 99.25% | 99.34% | 99.40% |
| squar5 | 81.36% | 89.11% | 95.94% |
| table3 | 97.07% | 97.30% | 97.98% |
| table5 | 97.09% | 97.54% | 97.76% |
| z5xp1 | 80.05% | 91.57% | 96.28% |
| Avg. | 91.70% | 94.58% | 96.43% |
| (c) 5 Prorated Faults | | | |
| alu4 | 82.00% | 87.07% | 91.40% |
| apex1 | 80.98% | 84.27% | 86.60% |
| apex2 | 95.65% | 96.80% | 96.94% |
| apex3 | 84.07% | 87.10% | 88.42% |
| apex4 | 76.11% | 80.99% | 85.25% |
| b12 | 65.69% | 79.41% | 86.44% |
| clip | 79.54% | 81.94% | 84.20% |
| cordic | 92.19% | 92.10% | 94.44% |
| ex5 | 76.67% | 78.13% | 80.38% |
| misex1 | 61.94% | 77.80% | 86.45% |
| misex2 | 83.03% | 84.31% | 90.96% |
| misex3 | 87.48% | 88.79% | 91.51% |
| rd84 | 79.36% | 83.15% | 86.13% |

TABLE V-continued

Reliability of Varying Protection Threshold Method with Prorated Faults

| Circuit | 95% | 98% | 99% |
|---|---|---|---|
| seq | 97.99% | 97.93% | 98.28% |
| squar5 | 65.85% | 75.12% | 90.48% |
| table3 | 93.40% | 93.79% | 95.36% |
| table5 | 92.78% | 94.23% | 95.23% |
| z5xp1 | 57.70% | 77.54% | 88.66% |
| Avg. | 80.69% | 85.58% | 89.84% |

The average reliability with protected C-element should have been close to 99% for all circuits, but there are some divergent cases like b12, misex1, misex2, squar5 and z5xp1 whose area is increased by a very large amount. Originally, these are the small circuits, therefore, with prorated faults we end up injecting lot of faults in those circuits and that is the cause of their worse reliability behavior. This also highlights the strength of selective transistor-redundancy scheme, as it can be augmented with the other techniques to improve them.

Accordingly, the selective transistor-redundancy method can be used if a certain level of reliability is desired to be achieved. This is also evident from the previous discussions, where it is shown that the protection threshold correlates strongly with the achieved reliability. The transistor-redundancy based on the area constraint algorithm is more suitable to a situation where there is a limitation on the overall area of a circuit. Additionally, the proposed algorithms can also work in tandem to search for a minimum area overhead required to achieve a certain reliability measure.

Each of the functions of the described embodiments may be implemented by one or more processing circuits. A processing circuit includes a programmed processor (for example, processor 1203 in FIG. 9), as a processor includes circuitry. A processing circuit also includes devices such as an application-specific integrated circuit (ASIC) and circuit components arranged to perform the recited functions. For instance, the controller of the processor in the wearable device 800 may include such processing circuitry that may be configured to perform the above stated functions.

The various features discussed above may be implemented by a computer system (or programmable logic). For instance, the base station (central server) may include processing circuitry that is configured to perform the functions of the above described embodiments. FIG. 9 illustrates such a computer system 1201.

The computer system 1201 includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

TABLE VI

Reliability of Minimum Area Overhead Method with Prorated Faults

| Circuit | 95% | 98% | 99% |
|---|---|---|---|
| (a) 1 Prorated Fault | | | |
| alu4 | 95.81% | 97.52% | 98.46% |
| apex1 | 96.55% | 97.45% | 98.70% |
| apex2 | 98.83% | 98.83% | 98.90% |
| apex3 | 95.87% | 97.78% | 98.24% |
| apex4 | 95.28% | 96.69% | 97.84% |
| b12 | 90.71% | 93.24% | 96.33% |
| clip | 92.99% | 96.23% | 98.11% |
| cordic | 97.87% | 98.37% | 98.97% |
| ex5 | 91.31% | 94.42% | 96.42% |
| misex1 | 84.95% | 94.48% | 97.01% |
| misex2 | 93.56% | 96.87% | 98.50% |
| misex3 | 97.31% | 97.38% | 98.45% |
| rd84 | 90.36% | 95.13% | 96.70% |
| seq | 99.25% | 97.60% | 96.25% |
| squar5 | 85.86% | 94.64% | 98.24% |
| table3 | 98.16% | 98.16% | 98.91% |
| table5 | 98.19% | 98.19% | 98.25% |
| z5xp1 | 86.67% | 95.47% | 97.39% |
| Avg. | 93.86% | 96.58% | 97.87% |
| (b) 2 Prorated Faults | | | |
| alu4 | 92.60% | 96.03% | 97.33% |
| apex1 | 93.00% | 96.75% | 97.13% |
| apex2 | 97.05% | 97.05% | 99.12% |
| apex3 | 92.30% | 95.99% | 96.89% |
| apex4 | 89.65% | 95.69% | 96.44% |
| b12 | 89.30% | 93.50% | 94.98% |
| clip | 89.88% | 93.51% | 95.21% |
| cordic | 96.60% | 96.57% | 97.11% |
| ex5 | 89.41% | 91.89% | 93.06% |
| misex1 | 80.58% | 90.48% | 91.03% |
| misex2 | 91.93% | 93.46% | 96.20% |
| misex3 | 94.15% | 96.21% | 97.12% |
| rd84 | 89.65% | 92.61% | 94.05% |
| seq | 99.25% | 97.60% | 96.25% |
| squar5 | 80.99% | 90.43% | 95.62% |
| table3 | 96.55% | 96.55% | 97.52% |
| table5 | 96.10% | 96.10% | 96.52% |
| z5xp1 | 79.02% | 91.11% | 95.81% |
| Avg. | 91.00% | 94.53% | 95.97% |
| (c) 5 Prorated Faults | | | |
| alu4 | 82.75% | 90.95% | 92.11% |
| apex1 | 82.45% | 88.61% | 90.80% |
| apex2 | 94.05% | 94.05% | 96.05% |
| apex3 | 81.30% | 88.20% | 90.72% |
| apex4 | 77.90% | 85.65% | 89.73% |
| b12 | 64.65% | 78.61% | 86.95% |
| clip | 73.80% | 80.08% | 83.32% |
| cordic | 91.25% | 92.66% | 93.03% |
| ex5 | 72.20% | 81.59% | 87.76% |
| misex1 | 58.24% | 65.17% | 77.95% |
| misex2 | 74.74% | 82.59% | 90.63% |
| misex3 | 88.10% | 88.67% | 89.47% |
| rd84 | 59.91% | 70.81% | 80.24% |
| seq | 99.25% | 97.60% | 96.25% |
| squar5 | 51.02% | 74.44% | 90.45% |
| table3 | 90.90% | 90.90% | 93.99% |
| table5 | 91.10% | 91.10% | 92.49% |
| z5xp1 | 55.64% | 72.61% | 86.04% |
| Avg. | 77.18% | 84.13% | 89.33% |

TABLE VII

TMR & DMR Reliability with Prorated Faults

| Circuit | OH | 1 Fault | 2 Faults | 5 Faults |
|---|---|---|---|---|
| (a) TMR Without Voter Protection | | | | |
| alu4 | 203.80% | 96.10% | 94.57% | 92.28% |
| apex1 | 206.70% | 96.41% | 95.12% | 94.86% |
| apex2 | 203.88% | 96.35% | 95.12% | 95.06% |
| apex3 | 211.75% | 96.60% | 94.72% | 94.01% |
| apex4 | 202.77% | 96.30% | 94.86% | 93.78% |
| b12 | 256.25% | 84.07% | 68.05% | 43.44% |
| clip | 209.51% | 94.63% | 91.10% | 81.15% |
| cordic | 205.84% | 96.46% | 94.73% | 94.44% |
| ex5 | 246.40% | 94.49% | 91.71% | 87.24% |
| misex1 | 233.69% | 91.12% | 84.01% | 65.89% |
| misex2 | 258.27% | 93.72% | 90.58% | 81.59% |
| misex3 | 205.24% | 96.74% | 95.51% | 95.39% |
| rd84 | 205.68% | 95.79% | 92.47% | 83.08% |
| seq | 204.97% | 96.69% | 95.21% | 95.73% |
| squar5 | 259.02% | 87.71% | 76.13% | 49.57% |
| table3 | 202.93% | 96.65% | 95.60% | 96.24% |
| table5 | 203.06% | 96.60% | 95.27% | 96.17% |
| z5xp1 | 225.39% | 91.43% | 84.08% | 66.05% |
| Avg. | 219.18% | 94.33% | 90.49% | 83.66% |
| (b) TMR with Protected Voter | | | | |
| alu4 | 210.58% | 99.88% | 95.08% | 95.06% |
| apex1 | 213.04% | 99.90% | 95.57% | 95.97% |
| apex2 | 206.68% | 99.66% | 95.41% | 95.96% |
| apex3 | 218.03% | 99.73% | 95.48% | 95.99% |
| apex4 | 207.37% | 99.89% | 95.52% | 95.90% |
| b12 | 351.57% | 94.39% | 83.91% | 66.30% |
| clip | 227.77% | 99.04% | 93.56% | 87.23% |
| cordic | 207.58% | 99.65% | 94.83% | 93.80% |
| ex5 | 273.96% | 98.88% | 93.95% | 91.23% |
| misex1 | 294.90% | 97.82% | 91.70% | 75.38% |
| misex2 | 291.94% | 98.63% | 92.92% | 88.10% |
| misex3 | 207.26% | 99.89% | 95.53% | 95.60% |
| rd84 | 215.28% | 99.43% | 93.47% | 84.50% |
| seq | 209.71% | 90.68% | 76.52% | 53.14% |
| squar5 | 364.37% | 99.91% | 95.84% | 97.68% |
| table3 | 204.33% | 99.71% | 95.32% | 97.18% |
| table5 | 204.75% | 99.67% | 95.33% | 96.50% |
| z5xp1 | 270.09% | 95.50% | 88.20% | 73.67% |
| Avg. | 243.29% | 98.46% | 92.67% | 87.73% |
| (c) DMR with non-protected C-Element Voter | | | | |
| alu4 | 102.53% | 98.04% | 97.26% | 91.89% |
| apex1 | 104.47% | 98.40% | 93.46% | 87.69% |
| apex2 | 102.59% | 98.28% | 96.67% | 90.84% |
| apex3 | 107.83% | 97.66% | 90.11% | 80.98% |
| apex4 | 101.85% | 98.89% | 95.63% | 92.87% |
| b12 | 137.50% | 80.71% | 67.19% | 33.06% |
| clip | 106.34% | 95.91% | 93.10% | 83.44% |
| cordic | 103.90% | 98.12% | 95.35% | 93.79% |
| ex5 | 130.93% | 92.19% | 72.39% | 53.54% |
| misex1 | 122.46% | 89.85% | 77.22% | 51.79% |
| misex2 | 138.85% | 89.96% | 68.95% | 48.22% |
| misex3 | 103.49% | 98.20% | 96.43% | 84.85% |
| rd84 | 103.79% | 97.78% | 91.26% | 76.64% |
| seq | 103.31% | 98.20% | 95.28% | 90.37% |
| squar5 | 139.34% | 83.48% | 71.15% | 39.15% |
| table3 | 101.95% | 98.80% | 97.13% | 93.08% |
| table5 | 102.04% | 98.80% | 96.51% | 93.63% |
| z5xp1 | 116.93% | 91.96% | 85.03% | 62.72% |
| Avg. | 112.78% | 94.74% | 87.78% | 76.75% |
| (d) DMR with Protected C-Element Voter | | | | |
| alu4 | 191.36% | 99.60% | 99.40% | 98.97% |
| apex1 | 261.16% | 99.98% | 99.80% | 99.70% |
| apex2 | 193.41% | 99.95% | 99.90% | 99.37% |
| apex3 | 382.58% | 99.90% | 99.88% | 99.60% |
| apex4 | 166.61% | 99.93% | 99.80% | 98.90% |
| b12 | 1452.32% | 96.58% | 72.98% | 18.77% |
| clip | 328.75% | 99.90% | 99.35% | 91.74% |
| cordic | 240.52% | 99.98% | 99.53% | 97.84% |
| ex5 | 1215.65% | 100.00% | 99.92% | 97.95% |
| misex1 | 910.05% | 98.78% | 88.31% | 51.83% |
| misex2 | 1501.15% | 99.80% | 96.67% | 67.86% |
| misex3 | 225.92% | 99.99% | 99.80% | 99.20% |
| rd84 | 236.53% | 99.90% | 99.24% | 93.72% |
| seq | 201.92% | 99.98% | 99.96% | 99.80% |
| squar5 | 1519.02% | 92.16% | 60.68% | 19.04% |
| table3 | 170.44% | 100.00% | 99.85% | 99.73% |
| table5 | 173.64% | 100.00% | 99.98% | 99.78% |
| z5xp1 | 750.53% | 99.53% | 95.43% | 65.10% |
| Avg. | 560.10% | 99.22% | 95.03% | 83.27% |

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, for displaying information to a computer user. The computer system includes input devices, such as a keyboard 1211 and a pointing device 1212, for interacting with a computer user and providing information to the processor 1203. The pointing device 1212, for example, may be a mouse, a trackball, a finger for a touch screen sensor, or a pointing stick for communicating direction information and command selections to the processor 1203 and for controlling cursor movement on the display 1210.

The processor 1203 executes one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to any of the teachings of the present disclosure and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes. Stored on any one or on a combination of computer readable media, the present disclosure includes software for controlling the computer system 1201, for driving a device or devices for implementing the invention, and for enabling the computer system 1201 to interact with a human user. Such software may include, but is not limited to, device drivers, operating systems, and applications software. Such computer readable media further includes the computer program product of the present disclosure for performing all or a portion (if processing is distributed) of the processing performed in implementing any portion of the invention. The computer code devices of the present embodiments may be any interpretable or executable code mechanism, including but not limited to scripts, interpretable programs, dynamic link libraries (DLLs), Java classes, and complete executable programs. Moreover, parts of the processing of the present embodiments may be distributed for better performance, reliability, and/or cost.

The term "computer readable medium" as used herein refers to any non-transitory medium that participates in providing instructions to the processor 1203 for execution. A computer readable medium may take many forms, including but not limited to, non-volatile media or volatile media. Non-volatile media includes, for example, optical, magnetic disks, and magneto-optical disks, such as the hard disk 1207 or the removable media drive 1208. Volatile media includes dynamic memory, such as the main memory 1204. Transmission media, on the contrary, includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present disclosure remotely into a dynamic memory and send the instructions over a telephone line using a modem. A modem local to the computer system 1201 may receive the data on the telephone line and place the data on the bus 1202. The bus 1202 carries the data to the main memory 1204, from which the processor 1203 retrieves and executes the instructions. The instructions received by the main memory 11204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an integrated services digital network (ISDN) card. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc.). The signals through the various networks and the signals on the network link 1214 and through the communication interface 1213, which carry the digital data to and from the computer system 1201 may be implemented in baseband signals, or carrier wave based signals.

The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214 and the communication interface 1213. Moreover, the network link 1214 may provide a connection through a LAN 1215 to a mobile device 1217 such as a personal digital assistant (PDA) laptop computer, or cellular telephone.

While aspects of the present disclosure have been described in conjunction with the specific embodiments thereof that are proposed as examples, alternatives, modifications, and variations to the examples may be made. It should be noted that, as used in the specification and the appended claims, the singular forms "a," "an," and "the" include plural referents unless the context clearly dictates otherwise.

What is claimed is:

1. A method of providing fault tolerance in a combinational circuit, the method comprising:
   identifying a plurality of sensitive gates of the combinational circuit that require protection from at least one of a first type of fault and a second type of fault;
   computing by circuitry, for each first type of transistor included in a sensitive gate, a first failure probability corresponding to the first type of fault, and for each second type of transistor included in the sensitive gate, a second failure probability corresponding to the second type of fault;
   calculating by circuitry, a first parameter corresponding to a number of the first type of transistors for which the computed first failure probabilities exceed a first predetermined threshold and a second parameter corresponding to a number of second type of transistors for which the computed second failure probabilities exceed a second predetermined threshold;
   determining, based on an area overhead of the combinational circuit and the calculated first parameter and second parameter, a protection type to be assigned to the sensitive gate of the combinational circuit;
   evaluating, based on the computing, the calculating, and the determining, a reliability factor of the combinational circuit;
   updating the combinational circuit based on the assigned protection type and area overhead to generate an updated combinational circuit having a different amount of transistors, the updated combinational circuit having enhanced fault tolerance.

2. The method of claim 1, wherein each sensitive gate of the plurality of sensitive gates of the combinational circuit is identified based on a fault simulation of the combinational circuit over a predetermined number of random inputs.

3. The method of claim 1, wherein the first type of fault is a stuck-at-zero fault corresponding to an alpha particle being impinged on a drain terminal of the first type of transistor of the sensitive gate when the output of the gate is at a first level, the alpha particle transforming the output of the gate from the first level to a second level.

4. The method of claim 3, wherein the second type of fault is a stuck-at-one fault corresponding to the alpha particle being impinged on a drain terminal of the second type of transistor of the sensitive gate when the output of the gate is at the second level, the alpha particle transforming the output of the gate from the second level to the first level.

5. The method of claim 1, wherein the first failure probability is computed based on a failure probability of the first type of transistor and a first fault detection probability of the sensitive gate.

6. The method of claim 5, wherein the second failure probability is computed based on a failure probability of the second type of transistor and a second fault detection probability of the sensitive gate.

7. The method of claim 1, wherein the protection type is one of a protection from only the first type of fault, a protection from only the second type of fault, and a protection from the first type of fault and the second type of fault.

8. The method of claim 7, wherein the protection from the first type of fault includes doubling the number of second type of transistors in the sensitive gate, and the protection from the second type of fault includes doubling the number of first type of transistors in the sensitive gate.

9. The method of claim 1, wherein the evaluating step further comprises:
generating a netlist of the first type of transistors and the second type of transistors from each of the sensitive gates;
selecting a predetermined number of transistors from the generated netlist;
injecting a fault in each of the selected transistors; and
computing, based on the injecting, a failure rate of the combinational circuit.

10. A non-transitory computer readable medium having stored thereon a program that when executed by a computer, causes the computer to execute a method providing fault tolerance in a combinational circuit, the method comprising:
identifying a plurality of sensitive gates of the combinational circuit that require protection from at least one of a first type of fault and a second type of fault;
computing for each first type of transistor included in the sensitive gate, a first failure probability corresponding to the first type of fault, and for each second type of transistor included in the sensitive gate, a second failure probability corresponding to the second type of fault;
calculating a first parameter corresponding to a number of the first type of transistors for which the computed first failure probabilities exceed a first predetermined threshold and a second parameter corresponding to a number of second type of transistors for which the computed second failure probabilities exceed a second predetermined threshold;
determining, based on an area overhead of the combinational circuit and the calculated first parameter and second parameter, a protection type to be assigned to the sensitive gate of the combinational circuit;
evaluating, based on the computing, the calculating, and the determining, a reliability factor of the combinational circuit; and
updating the combinational circuit based on the assigned protection type and area overhead to generate an updated combinational circuit having a different amount of transistors, the updated combinational circuit having enhanced fault tolerance.

11. The non-transitory computer readable medium of claim 10, wherein the first type of fault is a stuck-at-zero fault corresponding to an alpha particle being impinged on a drain terminal of the first type of transistor of the sensitive gate when the output of the gate is at a first level, the alpha particle transforming the output of the gate from the first level to a second level.

12. The non-transitory computer readable medium of claim 10, wherein the second type of fault is a stuck-at-one fault corresponding to the alpha particle being impinged on a drain terminal of the second type of transistor of the sensitive gate when the output of the gate is at the second level, the alpha particle transforming the output of the gate from the second level to the first level.

13. The non-transitory computer readable medium of claim 10, wherein the first failure probability is computed based on a failure probability of the first type of transistor and a first fault detection probability of the sensitive gate, and the second failure probability is computed based on a failure probability of the second type of transistor and a second fault detection probability of the sensitive gate.

14. The non-transitory computer readable medium of claim 10, wherein the protection type is one of a protection from only the first type of fault, a protection from only the second type of fault, and a protection from the first type of fault and the second type of fault.

15. The non-transitory computer readable medium of claim 14, wherein the protection from the first type of fault includes doubling the number of second type of transistors in the sensitive gate, and the protection from the second type of fault includes doubling the number of first type of transistors in the sensitive gate.

16. The non-transitory computer readable medium of claim 11, wherein the method further comprises:
generating a netlist of the first type of transistors and the second type of transistors from each of the sensitive gates;
selecting a predetermined number of transistors from the generated netlist;
injecting a fault in each of the selected transistors; and
computing, based on the injecting, a failure rate of the combinational circuit.

17. A device for providing fault tolerance in a combinational circuit, the device comprising:
circuitry configured to
identify a plurality of sensitive gates of the combinational circuit that require protection from at least one of a first type of fault and a second type of fault,
compute for each first type of transistor included in the sensitive gate, a first failure probability corresponding to the first type of fault, and for each second type of transistor included in the sensitive gate, a second failure probability corresponding to the second type of fault,
calculate a first parameter corresponding to a number of the first type of transistors for which the computed first failure probabilities exceed a first predetermined threshold and a second parameter corresponding to a number of second type of transistors for which the computed second failure probabilities exceed a second predetermined threshold,
determine based on an area overhead of the combinational circuit and the calculated first parameter and second parameter, a protection type to be assigned to the sensitive gate of the combinational circuit,
evaluate based on the computing, the calculating, and the determining, a reliability factor of the combinational circuit, and
update the combinational circuit based on the assigned protection type and area overhead to generate an updated combinational circuit having a different amount of transistors, the updated combinational circuit having enhanced fault tolerance.

18. The device of claim 17, wherein the first type of fault is a stuck-at-zero fault corresponding to an alpha particle being impinged on a drain terminal of the first type of transistor of the sensitive gate when the output of the gate is at a first level, the alpha particle transforming the output of the gate from the first level to a second level.

19. The device of claim 18, wherein the second type of fault is a stuck-at-one fault corresponding to the alpha particle being impinged on a drain terminal of the second type of transistor of the sensitive gate when the output of the gate is at the second level, the alpha particle transforming the output of the gate from the second level to the first level.

20. The device of claim 17, wherein the circuitry is further configured to:
- generate a netlist of the first type of transistors and the second type of transistors from each of the sensitive gates;
- select a predetermined number of transistors from the generated netlist;
- inject a fault in each of the selected transistors; and
- compute based on the injected faults, a failure rate of the combinational circuit.

* * * * *